(12) United States Patent
Suzuki et al.

(10) Patent No.: US 12,298,132 B2
(45) Date of Patent: *May 13, 2025

(54) OPTICAL DEVICE

(71) Applicant: HAMAMATSU PHOTONICS K.K., Hamamatsu (JP)

(72) Inventors: Tomofumi Suzuki, Hamamatsu (JP); Kyosuke Kotani, Hamamatsu (JP); Tatsuya Sugimoto, Hamamatsu (JP); Yutaka Kuramoto, Hamamatsu (JP); Katsumi Shibayama, Hamamatsu (JP); Noburo Hosokawa, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 24 days.

This patent is subject to a terminal disclaimer.

(21) Appl. No.: 18/121,164

(22) Filed: Mar. 14, 2023

(65) Prior Publication Data

US 2023/0221106 A1    Jul. 13, 2023

Related U.S. Application Data

(63) Continuation of application No. 16/625,693, filed as application No. PCT/JP2018/025646 on Jul. 6, 2018, now Pat. No. 11,629,947.

(30) Foreign Application Priority Data

Jul. 6, 2017    (JP) .................................. 2017-133089

(51) Int. Cl.
  *G01B 9/02*    (2022.01)
  *B81B 3/00*    (2006.01)
  (Continued)

(52) U.S. Cl.
  CPC ............ *G01B 9/02051* (2013.01); *B81B 3/00* (2013.01); *B81B 3/0021* (2013.01); *B81B 3/007* (2013.01);
  (Continued)

(58) Field of Classification Search
  CPC ............ G01B 9/02051; G01B 9/02049; G01B 2290/25; G01B 2290/35; B81B 3/00;
  (Continued)

(56) References Cited

U.S. PATENT DOCUMENTS 5,585,922 A    12/1996    Sueyoshi
5,870,221 A    2/1999    Goossen
(Continued)

FOREIGN PATENT DOCUMENTS

CN    1580861 A    2/2005
CN    1776476 A    5/2006
(Continued)

OTHER PUBLICATIONS

Machine translation of JP 2005309099 A retrieved electronically from Espacenet Jul. 25, 2022 (Year: 2022).*
(Continued)

*Primary Examiner* — Cara E Rakowski
(74) *Attorney, Agent, or Firm* — Faegre Drinker Biddle & Reath LLP

(57) ABSTRACT

In an optical device, a base and a movable unit are constituted by a semiconductor substrate including a first semiconductor layer, an insulating layer, and a second semiconductor layer in this order from one side in a predetermined direction. The base is constituted by the first semiconductor layer, the insulating layer, and the second semiconductor layer. The movable unit includes an arrangement portion that is constituted by the second semiconductor layer. The optical function unit is disposed on a surface of the arrangement
(Continued)

portion on the one side. The first semiconductor layer that constitutes the base is thicker than the second semiconductor layer that constitutes the base. A surface of the base on the one side is located more to the one side than the optical function unit.

9 Claims, 11 Drawing Sheets

(51) Int. Cl.
- G01J 3/02 (2006.01)
- G01J 3/10 (2006.01)
- G01J 3/14 (2006.01)
- G01J 3/45 (2006.01)
- G01J 3/453 (2006.01)
- G02B 7/182 (2021.01)
- G02B 26/08 (2006.01)
- G02B 27/14 (2006.01)

(52) U.S. Cl.
CPC ........ *G01B 9/02049* (2013.01); *G01J 3/0202* (2013.01); *G01J 3/021* (2013.01); *G01J 3/0237* (2013.01); *G01J 3/108* (2013.01); *G01J 3/14* (2013.01); *G01J 3/45* (2013.01); *G02B 7/182* (2013.01); *G02B 26/0816* (2013.01); *G02B 26/0833* (2013.01); *G02B 26/0841* (2013.01); *G02B 27/144* (2013.01); *B81B 2201/042* (2013.01); *B81B 2203/0154* (2013.01); *G01B 2290/25* (2013.01); *G01B 2290/35* (2013.01); *G01J 2003/104* (2013.01); *G01J 3/4532* (2013.01); *G01J 3/4535* (2013.01)

(58) Field of Classification Search
CPC . B81B 3/0021; B81B 3/007; B81B 2201/042; B81B 2203/0154; B81B 2203/053; G01J 3/0202; G01J 3/021; G01J 3/0237; G01J 3/108; G01J 3/14; G01J 3/45; G01J 3/4532; G01J 3/4535; G02B 7/182; G02B 26/0816; G02B 26/0833; G02B 26/0841; G02B 27/144

See application file for complete search history.

(56) References Cited

U.S. PATENT DOCUMENTS

| | | |
|---|---|---|
| 6,356,689 B1 | 3/2002 | Greywall |
| 6,392,807 B1 | 5/2002 | Barbarossa et al. |
| 6,411,427 B1 | 6/2002 | Peeters et al. |
| 6,535,290 B1 | 3/2003 | Spanner et al. |
| 6,552,801 B1 | 4/2003 | Akikuni et al. |
| 8,981,298 B2 | 3/2015 | Wagner et al. |
| 11,629,946 B2 | 4/2023 | Suzuki et al. |
| 2002/0135850 A1 | 9/2002 | Hagelin et al. |
| 2002/0167730 A1 | 11/2002 | Needham et al. |
| 2004/0070806 A1 | 4/2004 | Ryu et al. |
| 2005/0030606 A1* | 2/2005 | Nakajima ........... G02B 26/105 359/213.1 |
| 2005/0099665 A1 | 5/2005 | Lee et al. |
| 2005/0275847 A1 | 12/2005 | Moshe |
| 2005/0280331 A1 | 12/2005 | Wu et al. |
| 2006/0238768 A1 | 10/2006 | Brorson et al. |
| 2007/0216907 A1 | 9/2007 | Wang et al. |
| 2008/0014658 A1 | 1/2008 | Neubert et al. |
| 2008/0024767 A1 | 1/2008 | Seitz |
| 2008/0187325 A1 | 8/2008 | McCallion et al. |
| 2008/0284078 A1 | 11/2008 | Wolter et al. |
| 2009/0002805 A1 | 1/2009 | Yang et al. |
| 2009/0051874 A1 | 2/2009 | Masunishi et al. |
| 2009/0153844 A1 | 6/2009 | Peter et al. |
| 2009/0262346 A1 | 10/2009 | Egloff et al. |
| 2010/0067022 A1 | 3/2010 | Nebosis et al. |
| 2010/0208347 A1* | 8/2010 | Kouma ............... H02N 1/006 359/578 |
| 2010/0238456 A1 | 9/2010 | Speake et al. |
| 2011/0043661 A1 | 2/2011 | Podoleanu |
| 2011/0090551 A1 | 4/2011 | Pirk et al. |
| 2011/0205551 A1 | 8/2011 | Saito et al. |
| 2011/0285995 A1 | 11/2011 | Tkaczyk et al. |
| 2012/0085728 A1 | 4/2012 | Chen et al. |
| 2012/0249984 A1 | 10/2012 | De Boer et al. |
| 2013/0148966 A1 | 6/2013 | Kurokawa et al. |
| 2013/0155413 A1 | 6/2013 | Liesener et al. |
| 2013/0222809 A1 | 8/2013 | Hara |
| 2013/0278998 A1 | 10/2013 | Stephanou et al. |
| 2014/0022546 A1 | 1/2014 | Nagai et al. |
| 2014/0078509 A1 | 3/2014 | Moshe |
| 2014/0137670 A1 | 5/2014 | Hata et al. |
| 2014/0139924 A1 | 5/2014 | Warashina et al. |
| 2014/0152993 A1 | 6/2014 | Hirao |
| 2014/0192365 A1 | 7/2014 | Mortada et al. |
| 2014/0192412 A1 | 7/2014 | Imai |
| 2014/0234179 A1 | 8/2014 | Bita |
| 2015/0168215 A1 | 6/2015 | Day et al. |
| 2015/0177479 A1 | 6/2015 | Lee et al. |
| 2015/0329356 A1 | 11/2015 | Han et al. |
| 2015/0346479 A1 | 12/2015 | Hirokubo |
| 2016/0231172 A1 | 8/2016 | Medhat et al. |
| 2017/0018908 A1 | 1/2017 | Nakanishi |
| 2017/0357075 A1* | 12/2017 | Uchino ................ B81B 3/0045 |
| 2017/0363469 A1 | 12/2017 | Sabry et al. |
| 2018/0088336 A1* | 3/2018 | Hino ..................... G02B 27/20 |
| 2019/0033136 A1 | 1/2019 | Warashina et al. |
| 2021/0302717 A1 | 9/2021 | Man |

FOREIGN PATENT DOCUMENTS

| | | |
|---|---|---|
| CN | 1952727 A | 4/2007 |
| CN | 101285771 A | 10/2008 |
| CN | 101583857 A | 11/2009 |
| CN | 101655602 A | 2/2010 |
| CN | 101786592 A | 7/2010 |
| CN | 101871816 A | 10/2010 |
| CN | 102227667 A | 10/2011 |
| CN | 102445725 A | 5/2012 |
| CN | 102735163 A | 10/2012 |
| CN | 102759402 A | 10/2012 |
| CN | 103076090 A | 5/2013 |
| CN | 103288034 A | 9/2013 |
| CN | 103547528 A | 1/2014 |
| CN | 103582830 A | 2/2014 |
| CN | 103676135 A | 3/2014 |
| CN | 103885177 A | 6/2014 |
| CN | 103913235 A | 7/2014 |
| CN | 104034422 A | 9/2014 |
| CN | 104048759 A | 9/2014 |
| CN | 105022160 A | 11/2015 |
| CN | 105026975 A | 11/2015 |
| CN | 105103030 A | 11/2015 |
| CN | 105492879 A | 4/2016 |
| CN | 205262613 U | 5/2016 |
| CN | 105785549 A | 7/2016 |
| CN | 105890758 A | 8/2016 |
| CN | 105909517 A | 9/2016 |
| CN | 106500591 A | 3/2017 |
| DE | 4202606 | 9/1993 |
| DE | 19815241 A1 | 10/1999 |
| DE | 102006032267 A1 | 5/2007 |
| DE | 102008019600 A1 | 10/2009 |
| EP | 0338810 A2 | 10/1989 |
| EP | 0491435 A2 | 6/1992 |
| EP | 1193523 A2 | 4/2002 |
| EP | 2157467 A2 | 2/2010 |
| EP | 2778743 A1 | 9/2014 |
| GB | 2163548 A | 2/1986 |
| GB | 2344168 A | 5/2000 |
| GB | 2560494 A | 9/2018 |
| JP | S60-263801 A | 12/1985 |
| JP | H03-24440 A | 2/1991 |

(56) References Cited

FOREIGN PATENT DOCUMENTS

| | | |
|---|---|---|
| JP | H04-323502 A | 11/1992 |
| JP | H05-172738 A | 7/1993 |
| JP | H07-190712 A | 7/1995 |
| JP | H10-206458 A | 8/1998 |
| JP | H10-253912 A | 9/1998 |
| JP | H10-281719 A | 10/1998 |
| JP | H11-183116 A | 7/1999 |
| JP | 2001-296483 A | 10/2001 |
| JP | 2004-050305 A | 2/2004 |
| JP | 2004-198519 A | 7/2004 |
| JP | 2004-233412 A | 8/2004 |
| JP | 2004-255487 A | 9/2004 |
| JP | 2005-055670 A | 3/2005 |
| JP | 2005-223111 A | 8/2005 |
| JP | 2005-292033 A | 10/2005 |
| JP | 2005309099 A * | 11/2005 |
| JP | 2006-032716 A | 2/2006 |
| JP | 2006-343481 A | 12/2006 |
| JP | 2007-004074 A | 1/2007 |
| JP | 2007-21044 A | 2/2007 |
| JP | 2007-042786 A | 2/2007 |
| JP | 2007-155965 A | 6/2007 |
| JP | 2008-145839 A | 6/2008 |
| JP | 2008-233405 A | 10/2008 |
| JP | 2008-295174 A | 12/2008 |
| JP | 2009-42456 A | 2/2009 |
| JP | 2009-093105 A | 4/2009 |
| JP | 2009-150863 A | 7/2009 |
| JP | 2009-169290 A | 7/2009 |
| JP | 2010-054944 A | 3/2010 |
| JP | 2010-096997 A | 4/2010 |
| JP | 2010-512548 A | 4/2010 |
| JP | 2010-128116 A | 6/2010 |
| JP | 2010-170029 A | 8/2010 |
| JP | 2010-184334 A | 8/2010 |
| JP | 2010-259213 A | 11/2010 |
| JP | 2011-080854 A | 4/2011 |
| JP | 2012-042739 A | 3/2012 |
| JP | 2012-098505 A | 5/2012 |
| JP | 2012-107962 A | 6/2012 |
| JP | 2012-145675 A | 8/2012 |
| JP | 2012-524295 A | 10/2012 |
| JP | 2012-240129 A | 12/2012 |
| JP | 2012-242450 A | 12/2012 |
| JP | 2013-522600 A | 6/2013 |
| JP | 2013-178392 A | 9/2013 |
| JP | 2014-048366 A | 3/2014 |
| JP | 2016-012042 A | 1/2015 |
| JP | 2015-32739 A | 2/2015 |
| JP | 2015-143868 A | 8/2015 |
| JP | 2015-148781 A | 8/2015 |
| JP | 2015-184592 A | 10/2015 |
| JP | 2015-225153 A | 12/2015 |
| JP | 2016-085442 A | 5/2016 |
| JP | 2016-90250 A | 5/2016 |
| JP | 2016-515946 A | 6/2016 |
| JP | 2017-097304 A | 6/2017 |
| JP | 2017-194685 A | 10/2017 |
| JP | 6461446 B1 | 1/2019 |
| KR | 10-2006-0010421 * | 2/2006 ............ G02B 26/10 |
| TW | 201128224 A | 8/2011 |
| TW | 201210308 A | 3/2012 |
| TW | 201224562 A | 6/2012 |
| TW | 201243418 A | 11/2012 |
| WO | WO 03/085371 A2 | 10/2003 |
| WO | WO 2005/089098 A2 | 9/2005 |
| WO | WO 2008/071172 A1 | 6/2008 |
| WO | WO 2010/121185 A1 | 10/2010 |
| WO | WO 2010/122879 A1 | 10/2010 |
| WO | WO 2011/037015 A1 | 3/2011 |
| WO | WO 2011/037547 A2 | 3/2011 |
| WO | WO 2011/061514 A1 | 5/2011 |
| WO | WO 2011/112676 A1 | 9/2011 |
| WO | WO 2012/137470 A1 | 10/2012 |
| WO | WO 2012/157357 A1 | 11/2012 |
| WO | WO 2012/164810 A1 | 12/2012 |
| WO | WO 2014/117158 A1 | 7/2014 |
| WO | WO 2016/007272 A1 | 1/2016 |
| WO | WO 2016/080317 A1 | 5/2016 |
| WO | WO 2016/166872 A1 | 10/2016 |
| WO | WO 2017/087061 A1 | 5/2017 |
| WO | WO 2017/135357 A1 | 8/2017 |

OTHER PUBLICATIONS

Machine translation of KR 10 20160010421 retrieved electronically from Espacenet Jul. 20, 2024 (Year: 2024).*
International Preliminary Report on Patentability mailed Jan. 16, 2020 for PCT/JP2018/025646.
International Preliminary Report on Patentability mailed Jan. 16, 2020 for PCT/JP2018/025633.
International Preliminary Report on Patentability mailed Jan. 16, 2020 for PCT/JP2018/025641.
International Preliminary Report on Patentability mailed Jan. 16, 2020 for PCT/JP2018/025642.
International Preliminary Report on Patentability mailed Jan. 16, 2020 for PCT/JP2018/025644.
International Preliminary Report on Patentability mailed Jan. 16, 2020 for PCT/JP2018/025648.
International Preliminary Report on Patentability mailed Jan. 16, 2020 for PCT/JP2018/025645.
Lu Anjiang et al., "Fourier transform infrared spectrometer based on electro-thermal MEMS micro-mirror", Infrared and Laser Engineering, vol. 45, No. 5, May 2016.
Wojciech J. Waleckil et al., "Novel combined low-coherence interferometry spectrally resolved reflectometry compatible with high-resolution Raman spectroscopy for nondestructive characterization of MEMS structures", Conference on Reliability, Packaging, Testing, and Characterization of MEMS/MOEMS V, Jan. 26, 2006.

* cited by examiner

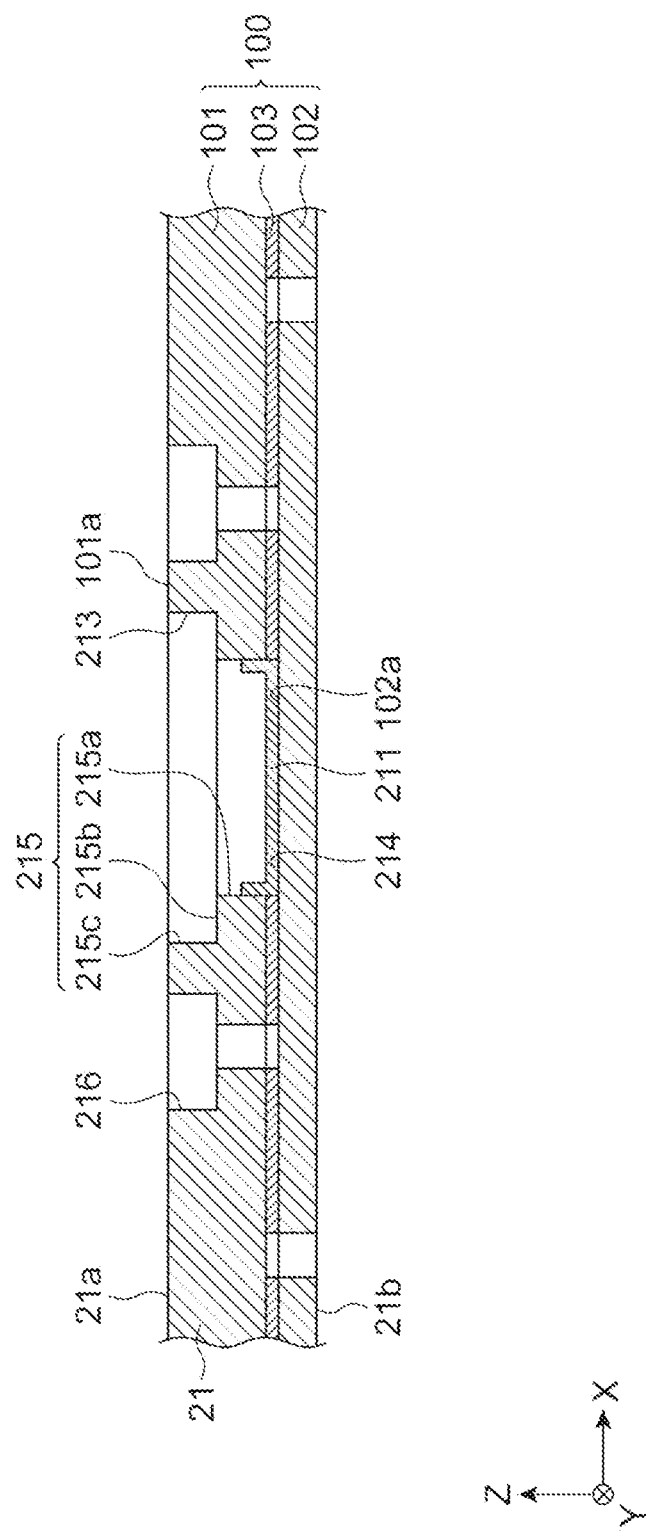

OPTICAL DEVICE

CROSS-REFERENCE TO RELATED APPLICATIONS

This application is a continuation application of U.S. application Ser. No. 16/625,693, filed on Dec. 21, 2019, which is a National Stage Entry of PCT/JP2018/025646, filed on Jul. 6, 2018, which claims the benefit of priority to Japanese Patent Application No. 2017-133089, filed on Jul. 6, 2017, the entire contents of which are incorporated herein by reference.

TECHNICAL FIELD

The present disclosure relates to an optical device.

BACKGROUND ART

An optical device in which an interference optical system is formed on a silicon on insulator (SOI) substrate by a micro electro mechanical system (MEMS) technology is known (for example, refer to Patent Literature 1). In the optical device, it is possible to provide a Fourier transformation type infrared spectral analyzer (FTIR) in which high-accuracy optical arrangement is realized, and thus the optical device has attracted attention.

CITATION LIST

Patent Literature

Patent Literature 1: Japanese Translation of PCT International Application Publication No. 2012-524295

SUMMARY OF INVENTION

Technical Problem

In the above-described optical device, a movable mirror that constitutes the interference optical system moves along a main surface of an SOI substrate. In contrast, it is considered to employ a configuration in which the movable mirror moves along a direction perpendicular to a main surface of the SOI substrate to realize an increase in size of a mirror surface of the movable mirror. However, when simply employing the configuration, there is a concern that it is difficult to sufficiently protect the mirror surface, and reliability as a device deteriorates.

An object of an aspect of the present disclosure is to provide an optical device with high reliability.

Solution to Problem

According to an aspect of the present disclosure, there is provided an optical device including: a base that includes a main surface; a movable unit that is supported in the base to be movable along a predetermined direction that intersects the main surface; and an optical function unit that is disposed on the movable unit. The base and the movable unit are constituted by a semiconductor substrate that includes a first semiconductor layer, an insulating layer, and a second semiconductor layer in this order from one side in the predetermined direction. The base is constituted by the first semiconductor layer, the insulating layer, and the second semiconductor layer. The movable unit includes an arrangement portion that is constituted by the second semiconductor layer. The optical function unit is disposed on a surface of the arrangement portion on the one side. The first semiconductor layer that constitutes the base is thicker than the second semiconductor layer that constitutes the base. A surface of the base on the one side is located more to the one side than the optical function unit.

In the optical device, the surface of the base on the one side is located more to the one side than the optical function unit. Accordingly, it is possible to protect the optical function unit by the base and it is possible to prevent the optical function unit from being damaged, for example, due to direct contact in transportation or the like. In addition, in the optical device, the first semiconductor layer that constitutes the base is thicker than the second semiconductor layer that constitutes the base. Accordingly, it is possible to secure a protrusion amount of the base with respect to the optical function unit, and it is possible to effectively protect the optical function unit by the base. Accordingly, according to the optical device, it is possible to enhance reliability.

The movable unit may further include a rib portion that is disposed at the periphery of the optical function unit, the rib portion may be constituted by the first semiconductor layer and the insulating layer which are disposed on the second semiconductor layer, and an end surface of the rib portion on the one side may be located more to the one side than the optical function unit. In this case, it is also possible to protect the optical function unit by the rib portion. In addition, it is also possible to suppress deformation of the movable unit during movement by the rib portion.

The rib portion may be disposed on the surface of the arrangement portion on the one side to extend along an outer edge of the arrangement portion when viewed from the predetermined direction. In this case, it is possible to dispose the rib portion to be closer to the optical function unit, and it is possible to more effectively protect the optical function unit. In addition, the rib portion is disposed on the arrangement portion, and thus it is possible to more appropriately suppress deformation of the arrangement portion.

The movable unit may further include a frame portion that surrounds the arrangement portion when viewed from the predetermined direction, and a connection portion that connects the arrangement portion and the frame portion, the frame portion and the connection portion may be constituted by the second semiconductor layer, and the rib portion may be disposed on a surface of the frame portion on the one side to extend along the frame portion when viewed from the predetermined direction. In this case, it is possible to more effectively protect the optical function unit by the rib portion. In addition, it is possible to suppress deformation of the frame portion due to the rib portion, and it is possible to suppress deformation of the arrangement portion which is caused by the deformation of the frame portion.

The first semiconductor layer that constitutes the rib portion may be thinner than the first semiconductor layer that constitutes the base. In this case, it is possible to suppress the rib portion from protruding from the base during movement of the movable unit, and it is possible to increase a movement amount of the movable unit in a predetermined direction.

The optical device according to the aspect of the present disclosure may further include an electrode pad that is provided in the base, the electrode pad may be disposed on a surface of the second semiconductor layer on the one side in an opening that is formed in the base to reach the second semiconductor layer from a surface of the first semiconductor layer on the one side, and the base may include a groove that reaches the second semiconductor layer from the surface of the first semiconductor layer on the one side, and extends to surround the opening when viewed from the predetermined direction. In this case, it is possible to reliably secure an electrical insulation property of the electrode pad due to the groove, and it is possible to further enhance reliability.

The electrode pad may extend along a bottom surface and a lateral surface of the opening. In this case, it is possible to increase an area of the electrode pad.

Each of the electrode pad and the optical function unit may be constituted by a metal layer, and the metal layer that constitutes the electrode pad may be thicker than the metal layer that constitutes the optical function unit. In this case, it is possible to suppress deformation of the optical function unit, and it is possible to reliably secure electrical connection to the electrode pad.

According to another aspect of the present disclosure, there is provided a mirror unit including: the above-described optical device; an optical function member that is disposed on the other side in the predetermined direction with respect to the optical device; and a fixed mirror that is disposed on the other side with respect to the optical function member. The optical function unit is a mirror surface that constitutes a movable mirror in combination with the movable unit. The optical device is provided with a first light passage portion that constitutes a first portion of an optical path between a beam splitter unit that constitutes an interference optical system in combination with the movable mirror and the fixed mirror, and the fixed mirror. The optical function member is provided with a second light passage portion that constitutes a second portion of the optical path between the beam splitter unit and the fixed mirror. The second light passage portion corrects an optical path difference that occurs between an optical path between the beam splitter unit and the movable mirror, and the optical path between the beam splitter unit and the fixed mirror.

In the mirror unit, it is possible to enhance reliability due to the above-described reason. In addition, it is possible to correct an optical path length difference that occurs between an optical path between the beam splitter unit and the movable unit, and an optical path between the beam splitter unit and the fixed mirror due to the second light passage portion of the optical function member. In addition, in the mirror unit, the mirror surface is disposed to be closer to the optical function member. This configuration is particularly effective for the case of correcting the optical path length difference by the second light passage portion of the optical function member.

Advantageous Effects of Invention

According to the aspect of the present disclosure, it is possible to provide an optical device with high reliability.

BRIEF DESCRIPTION OF DRAWINGS

FIG. 11 is a schematic cross-sectional view of the mirror device which is taken along line XI-XI illustrated in FIG. 2.

DESCRIPTION OF EMBODIMENTS

Figure 1:
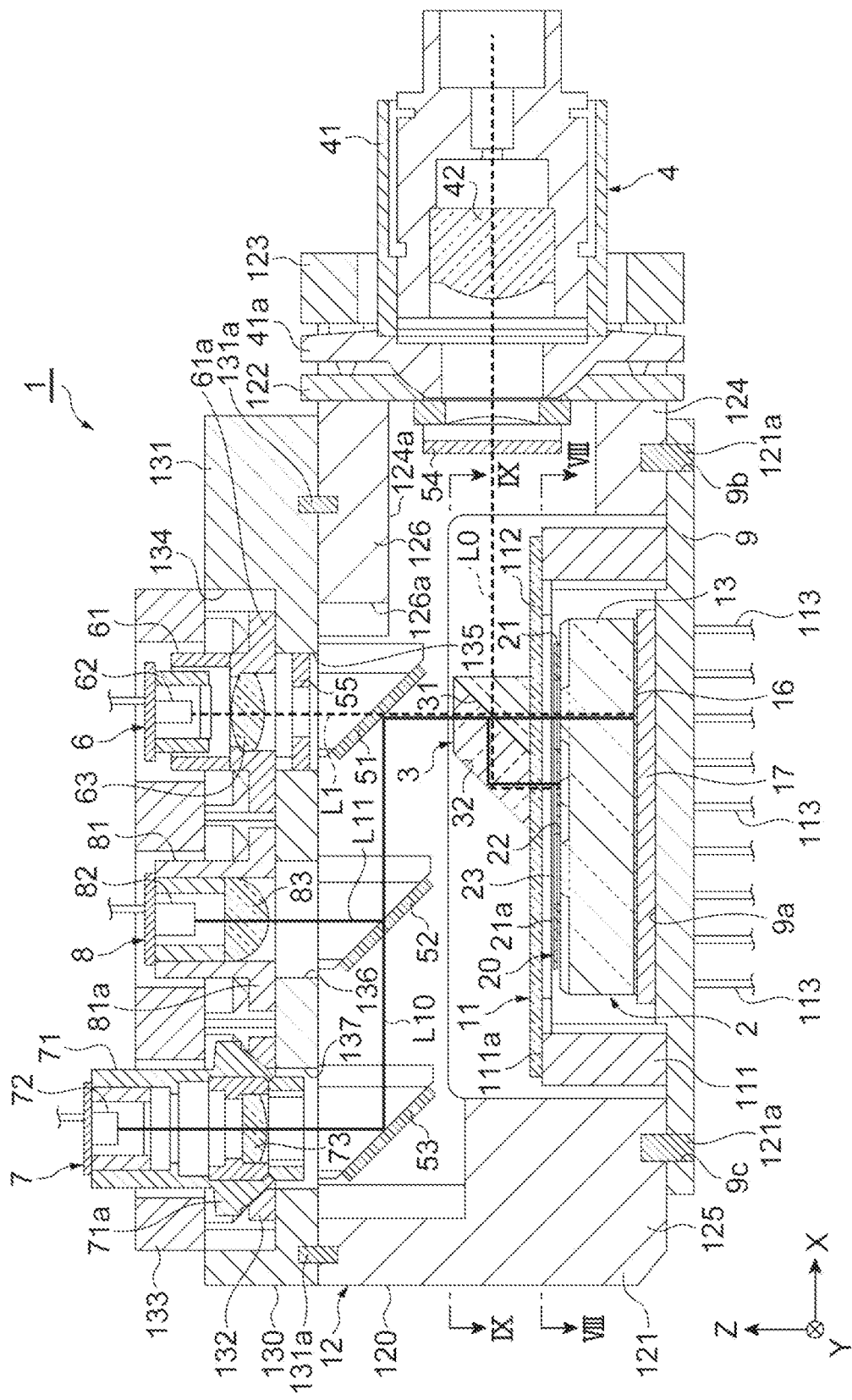
FIG. 1 is a cross-sectional view of an optical module of an embodiment.

Hereinafter, an embodiment of the present disclosure will be described in detail with reference to the accompanying drawings. The same reference numeral will be given to the same or equivalent parts in the respective drawings, and redundant description thereof will be omitted.

[Configuration of Optical Module]

As illustrated in FIG. 1, an optical module 1 includes a mirror unit 2, a beam splitter unit 3, a light incident unit 4, a first light detector 6, a second light source 7, a second light detector 8, a support 9, a first support structure 11, and a second support structure 12. The mirror unit 2 is disposed on one side of the support 9 in a Z-axis direction (a predetermined direction, a first direction), and is attached to the support 9, for example, by an adhesive. For example, the support 9 is formed of copper tungsten, and has a rectangular plate shape. The mirror unit 2 includes a movable mirror 22 that moves in the Z-axis direction, and a fixed mirror 16 of which a position is fixed (details thereof will be described later). For example, the Z-axis direction is a vertical direction, and the one side in the Z-axis direction is an upper side.

The beam splitter unit 3 is disposed on one side of the mirror unit 2 in the Z-axis direction, and is supported by the first support structure 11. The first support structure 11 is attached to the support 9, for example, by an adhesive. The light incident unit 4 is disposed on one side of the beam splitter unit 3 in an X-axis direction (a third direction perpendicular to the first direction), and is supported by the second support structure 12. The first light detector 6, the second light source 7, and the second light detector 8 are disposed on the one side of the beam splitter unit 3 in the Z-axis direction, and are supported by the second support structure 12. The second support structure 12 is attached to the support 9, for example, by a bolt.

In the optical module 1, an interference optical system is constituted by the beam splitter unit 3, the movable mirror 22, and the fixed mirror 16 with respect to each of measurement light L0 and laser light L10. The interference optical system which is constituted with respect to each of the measurement light L0 and the laser light L10 is, for example, a Michelson interference optical system.

With regard to the measurement light L0, interference light L1 of measurement light is detected as follows. That is, when the measurement light L0 that is incident from a first light source (not illustrated) through a measurement target (not illustrated) or the measurement light L0 that is generated from the measurement target (for example, light emitted from the measurement target itself, or the like) is incident to the beam splitter unit 3 from the light incident unit 4, the measurement light L0 is divided into a part and the remainder in the beam splitter unit 3. The part of the measurement light L0 is reflected by the movable mirror 22 that reciprocates in the Z-axis direction, and returns to the beam splitter unit 3. On the other hand, the remainder of the measurement light L0 is reflected by the fixed mirror 16 and returns to the beam splitter unit 3. The part and the remainder of the measurement light L0, which return to the beam splitter unit 3, are emitted from the beam splitter unit 3 as the interference light L1, and the interference light L1 of the measurement light is detected by the first light detector 6.

With regard to the laser light L10, interference light L11 of laser light is detected as follows. That is, when the laser light L10 emitted from the second light source 7 is incident to the beam splitter unit 3, the laser light L10 is divided into a part and the remainder in the beam splitter unit 3. The part of the laser light L10 is reflected by the movable mirror 22 that reciprocates in the Z-axis direction, and returns to the beam splitter unit 3. On the other hand, the remainder of the laser light L10 is reflected by the fixed mirror 16 and returns to the beam splitter unit 3. The part and the remainder of the laser light L10, which return to the beam splitter unit 3, are emitted from the beam splitter unit 3 as the interference light L11, and the interference light L11 of the laser light is detected by the second light detector 8.

According to the optical module 1, measurement of a position of the movable mirror 22 in the Z-axis direction can be measured based on a detection result of the interference light L11 of the laser light, and spectral analysis with respect to the measurement target can be performed based on a measurement result of the position, and a detection result of the interference light L1 of the measurement light.

[Configuration of Mirror Unit]

Figure 2:
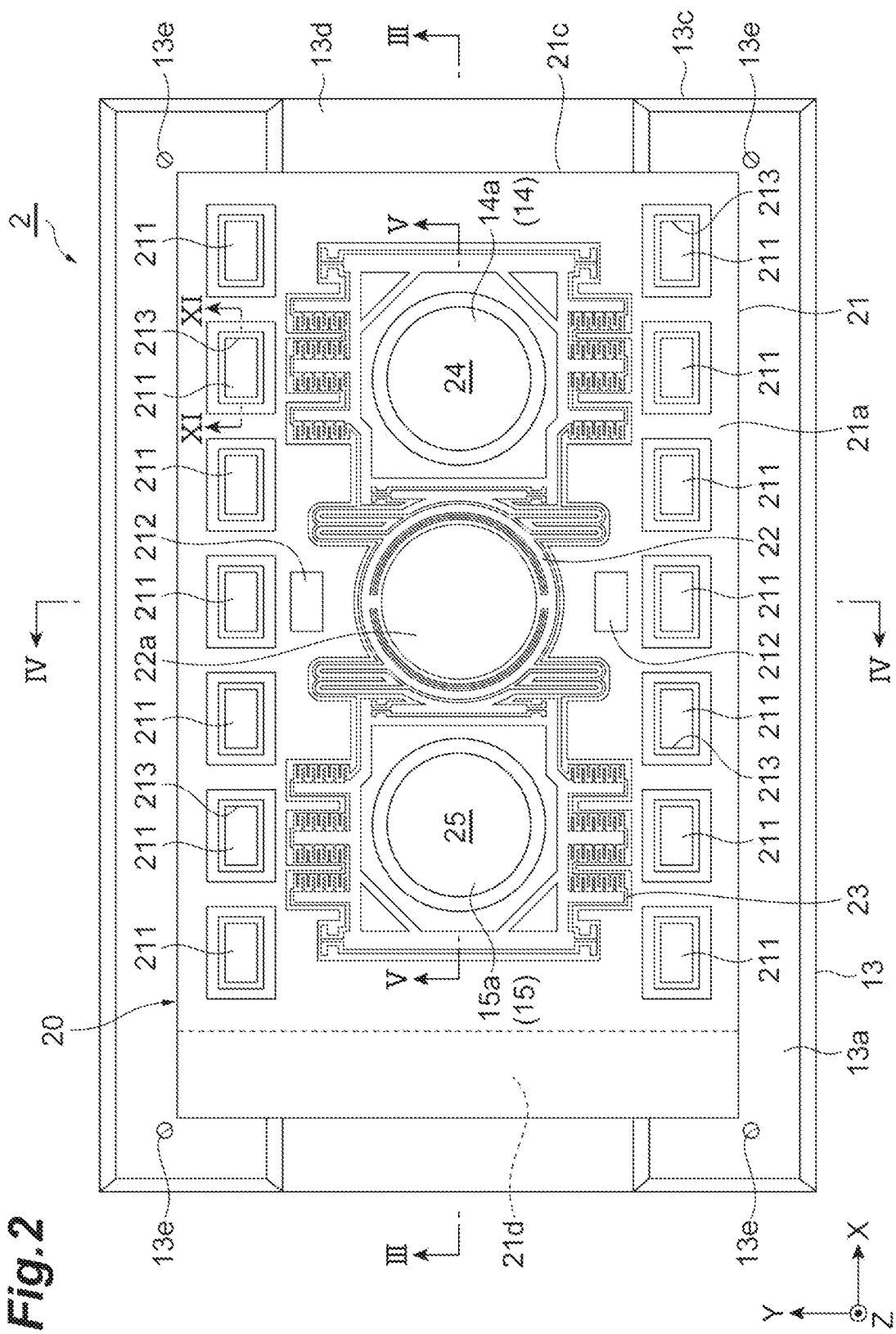
FIG. 2 is a plan view of a mirror unit illustrated in FIG. 1.
Figure 3:
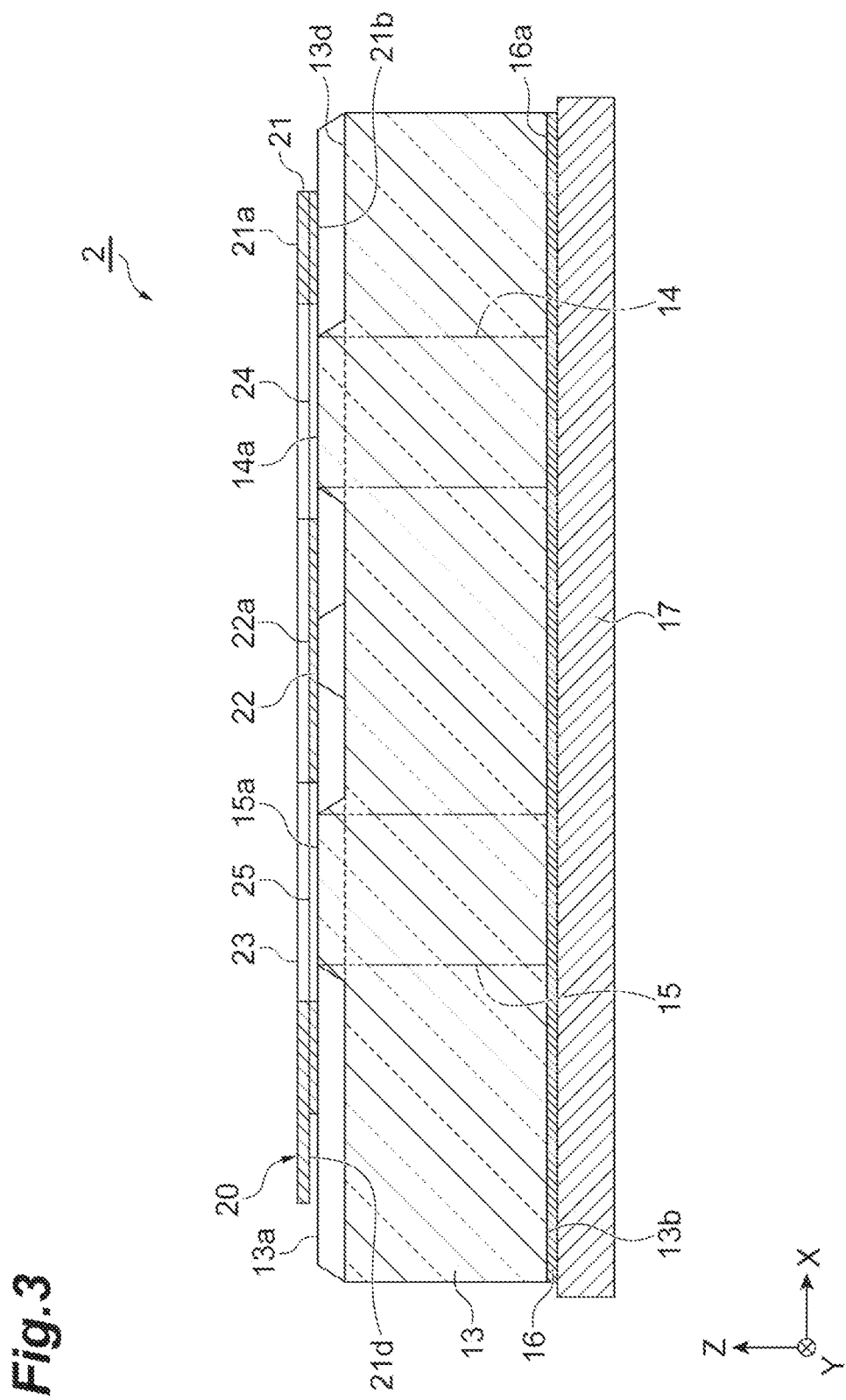
FIG. 3 is a cross-sectional view of the mirror unit which is taken along line illustrated in FIG. 2.
Figure 4:
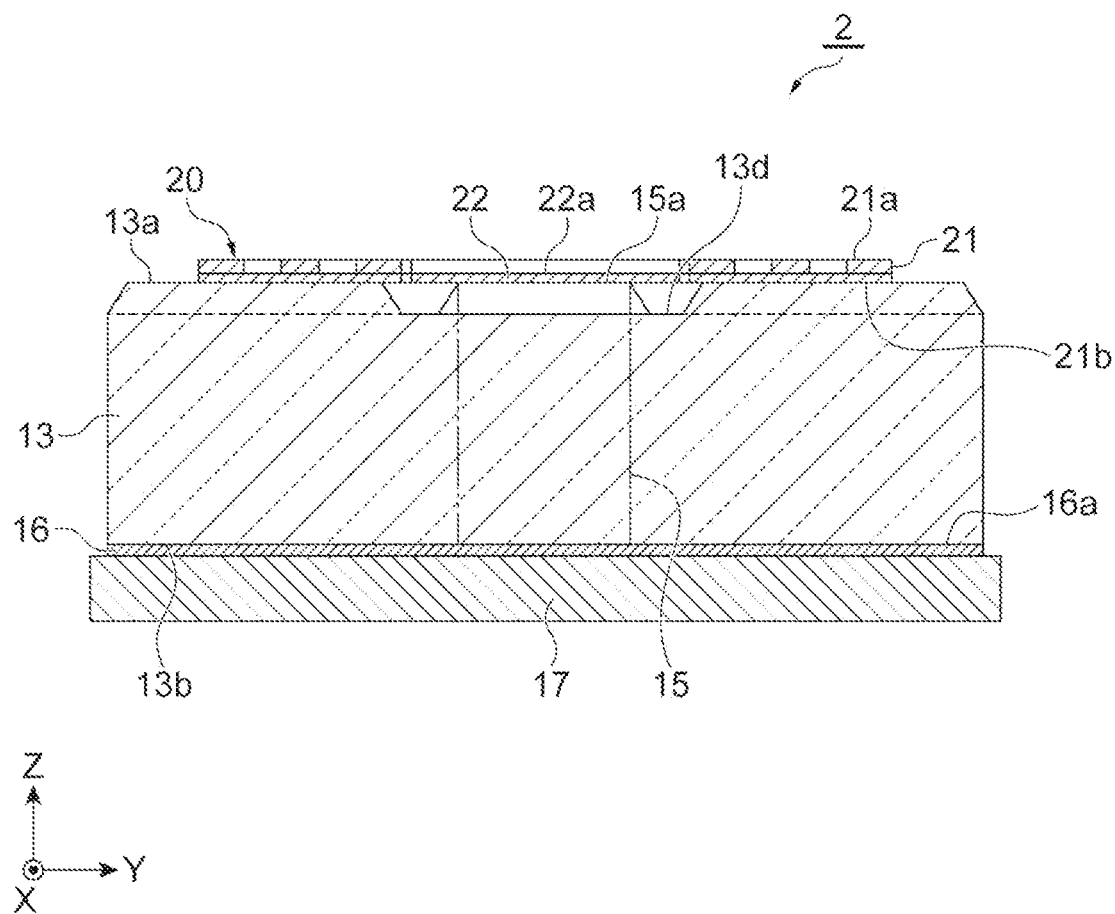
FIG. 4 is a cross-sectional view of the mirror unit which is taken along line IV-IV illustrated in FIG. 2.

As illustrated in FIG. 2, FIG. 3, and FIG. 4, the mirror unit 2 includes a mirror device (optical device) 20, an optical function member 13, the fixed mirror 16, and a stress mitigation substrate 17. The mirror device 20 includes a base 21, the movable mirror 22, and a drive unit 23.

The base 21 includes a first surface 21a (surface on the one side in the Z-axis direction) and a second surface 21b opposite to the first surface 21a. Each of the first surface 21a and the second surface 21b is a main surface of the base 21. For example, the base 21 has a rectangular plate shape, and a size of approximately 10 mm×15 mm×0.35 mm (thickness). The movable mirror 22 includes a mirror surface (optical function member) 22a, and a movable unit 22b in which the mirror surface 22a is disposed. The movable mirror 22 (movable unit 22b) is supported in the base 21 so that the movable mirror 22 can move in the Z-axis direction perpendicular to the first surface 21a (a predetermined direction perpendicular to the first surface). The drive unit 23 moves the movable mirror 22 in the Z-axis direction.

A pair of light passage openings 24 and 25 are provided in the mirror device 20. The pair of light passage openings 24 and 25 are respectively disposed on both sides of the movable mirror 22 in the X-axis direction. The light passage opening (first light passage portion) 24 constitutes a first portion of an optical path between the beam splitter unit 3 and the fixed mirror 16. In this embodiment, the light passage opening 25 does not function as a light passage opening.

Figure 5:
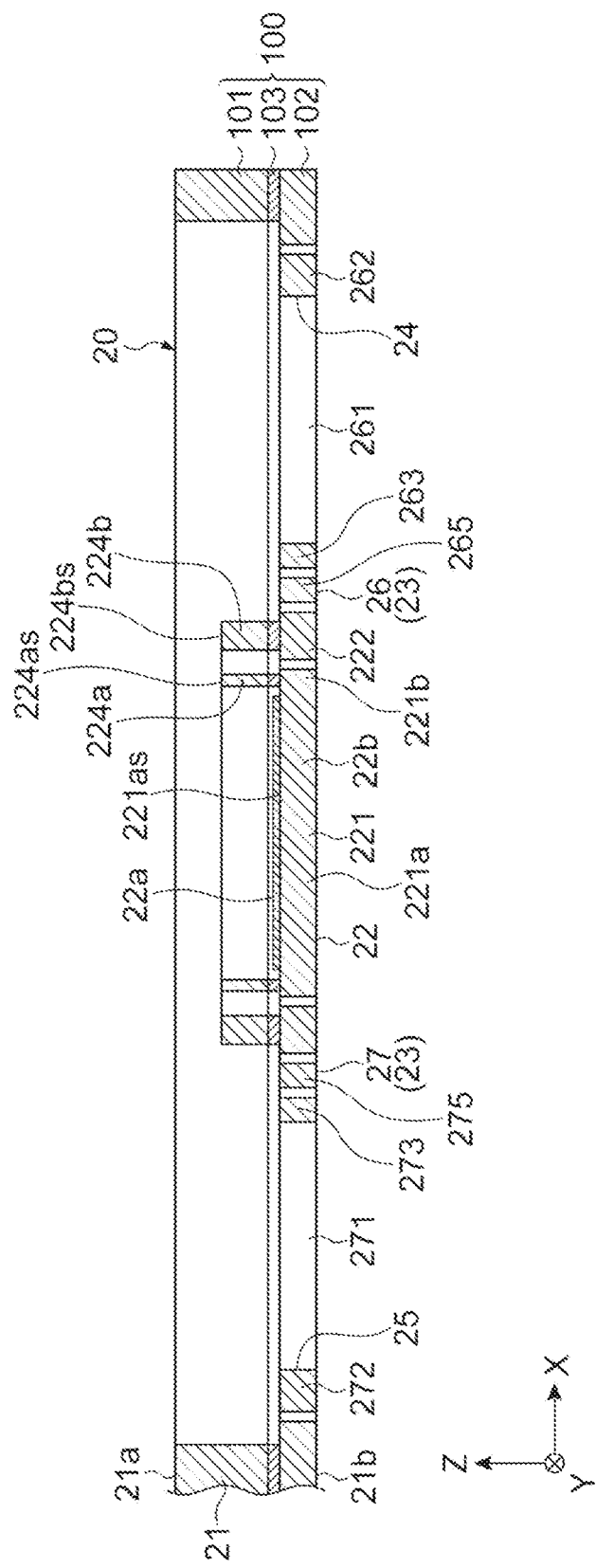
FIG. 5 is a schematic cross-sectional view of a mirror device which is taken along line V-V illustrated in FIG. 2.
Figure 6:
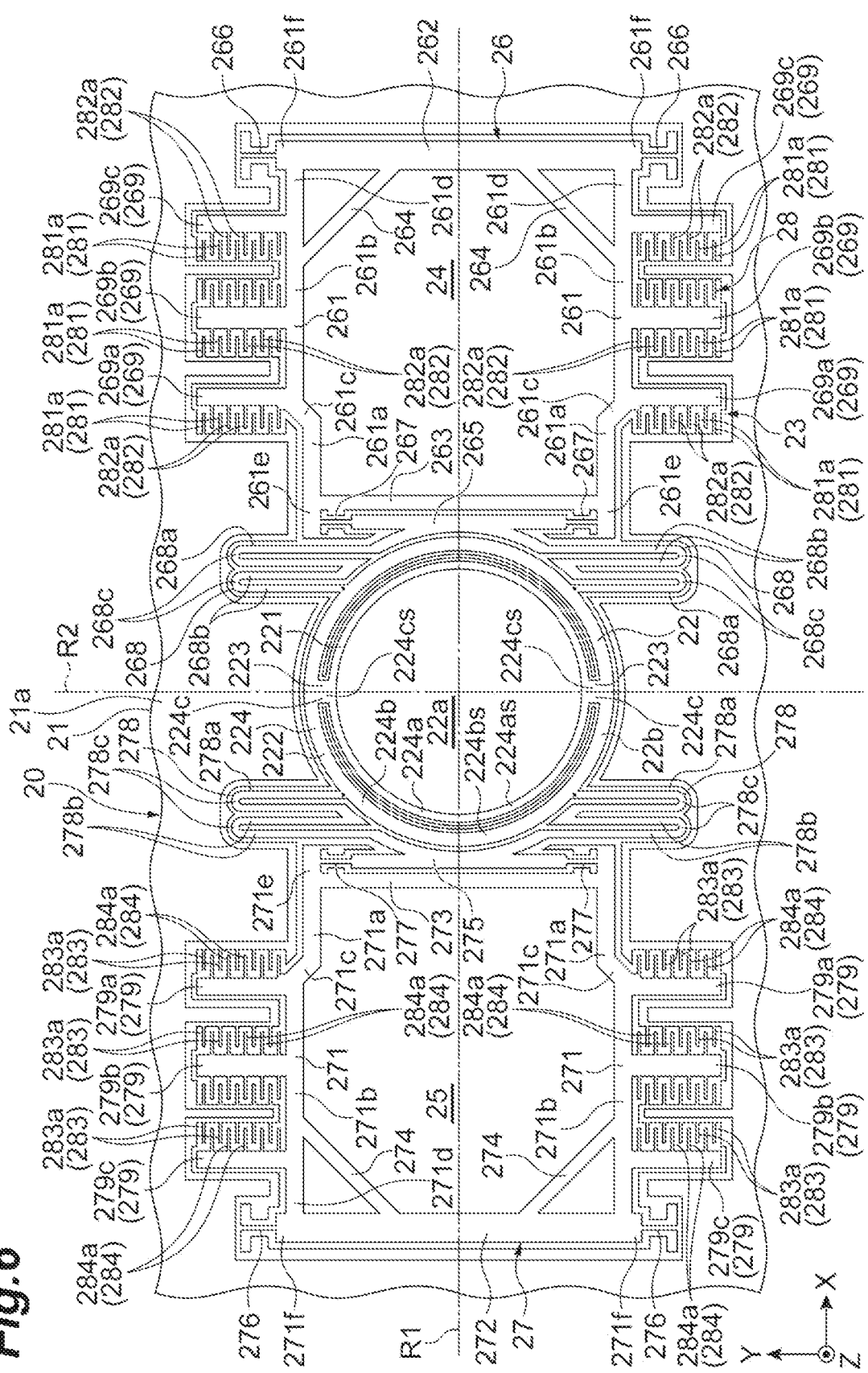
FIG. 6 is a partially enlarged view of the mirror device illustrated in FIG. 2.
Figure 7:
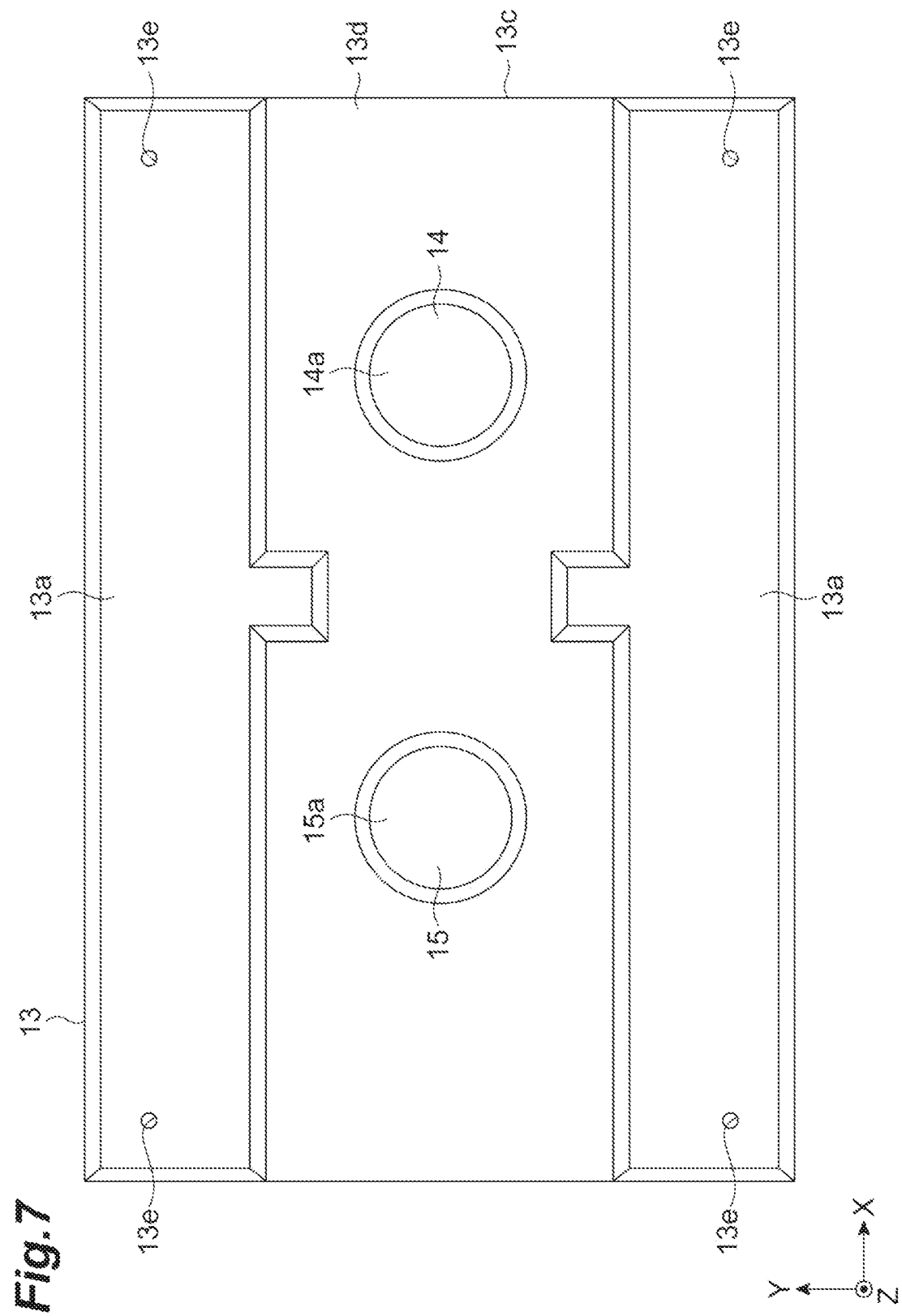
FIG. 7 is a plan view of an optical function member illustrated in FIG. 2.

Here, a configuration of the mirror device 20 will be described in detail with reference to FIG. 2, FIG. 5, and FIG. 6. FIG. 5 is a schematic cross-sectional view of the mirror device 20 illustrated in FIG. 3, and FIG. 5 schematically illustrates the mirror device 20, for example, in a state in which dimensions in the Z-axis direction are enlarged in comparison to actual dimensions.

The base 21, the movable unit 22b of the movable mirror 22, and the drive unit 23 are constituted by a silicon on insulator (SOI) substrate (semiconductor substrate) 100. That is, the mirror device 20 is constituted by the SOI substrate 100. For example, the mirror device 20 is formed in a rectangular plate shape. The SOI substrate 100 includes a support layer 101, a device layer 102, and an intermediate layer 103. The support layer 101 is a first silicon layer (a first semiconductor layer). The device layer 102 is a second silicon layer (a second semiconductor layer). The intermediate layer 103 is an insulating layer that is disposed between the support layer 101 and the device layer 102. The SOI substrate 100 includes the support layer 101, the intermediate layer 103, and the device layer 102 in this order from the one side in the Z-axis direction.

The base 21 is constituted by a part of the support layer 101, the device layer 102, and the intermediate layer 103. The first surface 21a of the base 21 is a surface of the support layer 101 which is opposite to the intermediate layer 103. The second surface 21b of the base 21 is a surface of the device layer 102 which is opposite to the intermediate layer 103. The support layer 101 that constitutes the base 21 is thicker than the device layer 102 that constitutes the base 21. For example, the thickness of the support layer 101 that constitutes the base 21 is approximately four times the thickness of the device layer 102 that constitutes the base 21. As will be described later, in the mirror unit 2, the second surface 21b of the base 21 and a third surface 13a of the optical function member 13 are jointed to each other (refer to FIG. 3 and FIG. 4).

The movable mirror 22 is disposed in a state in which an intersection between an axial line R1 and an axial line R2 is set as the central position (gravity center position). The axial line R1 is a straight line that extends in the X-axis direction. The axial line R2 is a straight line that extends in a Y-axis direction (a second direction perpendicular to the first direction and the third direction). When viewed from the Z-axis direction, in the mirror device 20, a portion other than a portion that overlaps a sixth surface 21d of the base 21 to be described later has a shape that is linearly symmetric to each of the axial line R1 and the axial line R2.

The movable mirror 22 (movable unit 22b) includes an arrangement portion 221, a frame portion 222, a pair of connection portions 223, and a rib portion 224. The arrangement portion 221, the frame portion 222, and the pair of connection portions 223 are constituted by a part of the device layer 102. The arrangement portion 221 has a circular shape when viewed from the Z-axis direction. The arrangement portion 221 includes a central portion 221a and an edge portion 221b. For example, the mirror surface 22a is provided on a surface 221as of the central portion 221a on the one side in the Z-axis direction by forming a metal film (metal layer) thereon. The mirror surface 22a extends perpendicular to the Z-axis direction, and has a circular shape. The surface 221as of the central portion 221a is a surface on the intermediate layer 103 side in the device layer 102. The mirror surface 22a is located on the other side in the Z-axis direction in comparison to the first surface 21a of the base 21. In other words, the first surface 21a is located on the one side in the Z-axis direction in comparison to the mirror surface 22a. The edge portion 221b surrounds the central portion 221a when viewed from the Z-axis direction.

The frame portion 222 extends in an annular shape to surround the arrangement portion 221 with a predetermined gap from the arrangement portion 221 when viewed from the Z-axis direction. For example, the frame portion 222 has a circular ring shape when viewed from the Z-axis direction. Each of the pair of connection portions 223 connects the arrangement portion 221 and the frame portion 222 to each other. The pair of connection portions 223 are respectively disposed on both sides of the arrangement portion 221 in the Y-axis direction.

The rib portion 224 is constituted by the support layer 101 and the intermediate layer 103 which are disposed on the device layer 102. The rib portion 224 is disposed at the periphery of the mirror surface 22a. The rib portion 224 includes an inner rib portion 224a, an outer rib portion 224b, and a pair of connection rib portions 224c. The inner rib portion 224a is disposed on a surface of the edge portion 221b on the one side in the Z-axis direction. The inner rib portion 224a surrounds the mirror surface 22a when viewed from the Z-axis direction. For example, an outer edge of the inner rib portion 224a extends along an outer edge of the arrangement portion 221 with a predetermined gap from the outer edge of the arrangement portion 221 when viewed from the Z-axis direction. An inner edge of the inner rib portion 224a extends along an outer edge of the mirror surface 22a with a predetermined gap from the outer edge of the mirror surface 22a when viewed from the Z-axis direction. An end surface 224as of the inner rib portion 224a on the one side in the Z-axis direction is located on the one side in the Z-axis direction in comparison to the mirror surface 22a.

The outer rib portion 224b is disposed on a surface of the frame portion 222 on the one side in the Z-axis direction. The outer rib portion 224b surrounds the inner rib portion 224a and the mirror surface 22a when viewed from the Z-axis direction. For example, an outer edge of the outer rib portion 224b extends along an outer edge of the frame portion 222 with a predetermined gap from the outer edge of the frame portion 222 when viewed from the Z-axis direction. An inner edge of the outer rib portion 224b extends along an inner edge of the frame portion 222 with a predetermined gap from the inner edge of the frame portion 222 when viewed from the Z-axis direction. An end surface 224bs of the outer rib portion 224b on the one side in the Z-axis direction is located on the one side in the Z-axis direction in comparison to the mirror surface 22a.

The pair of connection rib portions 224c are respectively disposed on surfaces of the pair of connection portions 223 on the one side in the Z-axis direction. The connection rib portions 224c connect the inner rib portion 224a and the outer rib portion 224b to each other. End surfaces 224cs of the connection rib portions 224c on the one side in the Z-axis direction are located on the one side in the Z-axis direction in comparison to the mirror surface 22a.

The thickness of the inner rib portion 224a, the thickness of the outer rib portion 224b, and the thickness of the respective connection rib portions 224c in the Z-axis direction are the same as each other. That is, the thickness of the support layer 101 that constitutes the inner rib portion 224a, the outer rib portion 224b, and the respective connection rib portions 224c is the same in each case. The end surface 224as of the inner rib portion 224a, the end surface 224bs of the outer rib portion 224b, and the end surfaces 224cs of the respective connection rib portions 224c are located on the same plane perpendicular to the Z-axis direction. The support layer 101 that constitutes the inner rib portion 224a, the outer rib portion 224b, and the respective connection rib portions 224c is thinner than the support layer 101 that constitutes the base 21. Accordingly, the end surfaces 224as, 224bs, and 224cs are located on the one side in the Z-axis direction in comparison to the first surface 21a of the base 21. In other words, the first surface 21a is located on the other side in the Z-axis direction in comparison to the end surfaces 224as, 224bs, and 224cs.

When viewed from the Z-axis direction, a width of the outer rib portion 224b is wider than a width of the inner rib portion 224a. The width of the inner rib portion 224a when viewed from the Z-axis direction is a length of the inner rib portion 224a in a direction perpendicular to the extending direction of the inner rib portion 224a, and is a length of the inner rib portion 224a in a radial direction of the inner rib portion 224a in this embodiment. This is also true of a width of the outer rib portion 224b when viewed from the Z-axis direction. A width of each of the connection rib portions 224c is larger than the width of each of the inner rib portion 224a and the outer rib portion 224b. The width of each of the connection rib portion 224c is a length of each of the connection rib portion 224c along the extending direction of the inner rib portion 224a.

The drive unit 23 includes a first elastic support unit 26, a second elastic support unit 27, and an actuator unit 28. The first elastic support unit 26, the second elastic support unit 27, and the actuator unit 28 are constituted by a part of the device layer 102.

Each of the first elastic support unit 26 and the second elastic support unit 27 is connected between the base 21 and the movable mirror 22. The first elastic support unit 26 and the second elastic support unit 27 support the movable mirror 22 so that the movable mirror 22 (movable unit 22b) can move in the Z-axis direction.

The first elastic support unit 26 includes a pair of levers 261, a first link member 262, a second link member 263, a pair of beam members 264, an intermediate member 265, a pair of first torsion bars (first torsion support portions) 266, a pair of second torsion bars (second torsion support portions) 267, a pair of non-linearity mitigation springs 268, and a plurality of electrode support portions 269.

The pair of levers 261 are respectively disposed on both sides of the light passage opening 24 in the Y-axis direction, and face each other in the Y-axis direction. Each of the levers 261 has a plate shape that extends along a plane perpendicular to the Z-axis direction. The lever 261 includes a first portion 261a, a second portion 261b that is disposed on a side opposite to the movable mirror 22 with respect to the first portion 261a, and a third portion 261c that is connected to the first portion 261a and the second portion 261b. The first portion 261a and the second portion 261b extend in the X-axis direction. A length of the first portion 261a in the X-axis direction is shorter than a length of the second portion 261b in the X-axis direction. The third portions 261c of the pair of levers 261 obliquely extend to be spaced away from each other as going away from the movable mirror 22.

The first link member 262 bridges first ends 261d of the pair of levers 261 on a side opposite to the movable mirror 22. The first link member 262 has a plate shape that extends along a plane perpendicular to the Z-axis direction, and extends in the Y-axis direction. The second link member 263 bridges second ends 261e of the pair of levers 261 on the movable mirror 22 side. The second link member 263 has a plate shape that extends along a plane perpendicular to the Z-axis direction, and extends in the Y-axis direction. A width of the second link member 263 in the X-axis direction is narrower than a width of the first link member 262 in the X-axis direction. A length of the second link member 263 in the Y-axis direction is shorter than a length of the first link member 262 in the Y-axis direction.

The pair of beam members 264 respectively bridge the second portions 261b of the pair of levers 261 and the first link member 262. The respective beam members 264 have a plate shape that extends along a plane perpendicular to the Z-axis direction. The pair of beam members 264 obliquely extend to approach each other as going away from the movable mirror 22. The pair of levers 261, the first link member 262, the second link member 263, and the pair of beam members 264 define the light passage opening 24. The light passage opening 24 has a polygonal shape when viewed from the Z-axis direction. For example, the light passage opening 24 is a cavity (hole). Alternatively, a material having optical transparency with respect to the measurement light L0 and the laser light L10 may be disposed in the light passage opening 24.

The intermediate member 265 has a plate shape that extends along a plane perpendicular to the Z-axis direction, and extends in the Y-axis direction. The intermediate member 265 is disposed between the movable mirror 22 and the second link member 263 (in other words, between the movable mirror 22 and the light passage opening 24). The intermediate member 265 is connected to the movable mirror 22 through the non-linearity mitigation springs 268 as to be described later.

The pair of first torsion bars 266 respectively bridge the first end 261d of one lever 261 and the base 21, and the first end 261d of the other lever 261 and the base 21. That is, the pair of first torsion bars 266 are respectively connected between the pair of levers 261 and the base 21. The first torsion bars 266 extend in the Y-axis direction. The pair of first torsion bars 266 are disposed on the same central line parallel to the Y-axis direction. In this embodiment, the central line of the first torsion bars 266 and the central line of the first link member 262 are located on the same straight line. A protrusion 261f that protrudes outward in the Y-axis direction is provided in each of the first ends 261d of the levers 261, and each of the first torsion bars 266 is connected to the protrusion 261f.

The pair of second torsion bars 267 respectively bridge the second end 261e of one lever 261 and one end of the intermediate member 265, and the second end 261e of the other lever 261 and the other end of the intermediate member 265. That is, the pair of second torsion bars 267 are respectively connected between the pair of levers 261 and the movable mirror 22. The respective second torsion bars 267 extend in the Y-axis direction. The pair of second torsion bars 267 are disposed on the same central line parallel to the Y-axis direction.

The pair of non-linearity mitigation springs 268 are connected between the movable mirror 22 and the intermediate member 265. That is, the pair of non-linearity mitigation springs 268 are connected between the movable mirror 22 and the second torsion bar 267. Each of the non-linearity mitigation springs 268 includes a meandering portion 268a that extends in a meandering manner when viewed from the Z-axis direction. The meandering portion 268a includes a plurality of straight portions 268b which extend in the Y-axis direction and are aligned in the X-axis direction, and a plurality of folded portions 268c which alternately connect both ends of the plurality of straight portions 268b. One end of the meandering portion 268a is connected to the intermediate member 265, and the other end of the meandering portion 268a is connected to the frame portion 222. In the meandering portion 268a, a portion on the frame portion 222 side has a shape along the outer edge of the frame portion 222.

The non-linearity mitigation spring 268 is constituted as follows. In a state in which the movable mirror 22 has moved in the Z-axis direction, the amount of deformation of the non-linearity mitigation spring 268 around the Y-axis direction becomes smaller than the amount of deformation of each of the first torsion bar 266 and the second torsion bar 267 around the Y-axis direction, and the amount of deformation of the non-linearity mitigation spring 268 in the X-axis direction becomes larger than the amount of deformation of each of the first torsion bar 266 and the second torsion bar 267 in the X-axis direction. Accordingly, it is possible to suppress occurrence of non-linearity in twist deformation of the first torsion bar 266 and the second torsion bar 267, and it is possible to suppress deterioration of control characteristics of the movable mirror 22 due to the non-linearity. The amount of deformation of the first torsion bar 266, the second torsion bar 267, and the non-linearity mitigation spring 268 around the Y-axis direction represents, for example, an absolute value of a twist amount (twist angle). The amount of deformation of the first torsion bar 266, the second torsion bar 267, and the non-linearity mitigation spring 268 in the X-axis direction represents, for example, an absolute value of a deflection amount. The amount of deformation of a member around the Y-axis direction represents the amount of deformation of the member in a peripheral direction of a circle of which the center is set to an axial line that passes through the center of the member and is parallel to the Y-axis. This is also true of first torsion bars 276, second torsion bars 277, and a non-linearity mitigation spring 278 to be described later.

The plurality of electrode support portions 269 include a pair of first electrode support portions 269a, a pair of second electrode support portions 269b, and a pair of third electrode support portions 269c. Each of the electrode support portions 269a, 269b, and 269c has a plate shape that extends along a plane perpendicular to the Z-axis direction, and extends in the Y-axis direction. Each of the electrode support portions 269a, 269b, and 269c extends from the second portion 261b of the lever 261 toward a side opposite to the light passage opening 24. The pair of first electrode support portions 269a are disposed on the same central line parallel to the Y-axis direction. The pair of second electrode support portions 269b are disposed on the same central line parallel to the Y-axis direction. The pair of third electrode support portions 269c are disposed on the same central line parallel to the Y-axis direction. In the X-axis direction, the first electrode support portions 269a, the second electrode support portions 269b, and the third electrode support portions 269c are aligned in this order from the movable mirror 22 side.

The second elastic support unit 27 includes a pair of levers 271, a first link member 272, a second link member 273, a pair of beam members 274, an intermediate member 275, a pair of first torsion bars (first torsion support portions) 276, a pair of second torsion bars (second torsion support portions) 277, a pair of non-linearity mitigation springs 278, and a plurality of electrode support portions 279.

The pair of levers 271 are respectively disposed on both sides of the light passage opening 25 in the Y-axis direction, and face each other in the Y-axis direction. Each of the levers 271 has a plate shape that extends along a plane perpendicular to the Z-axis direction. The lever 271 includes a first portion 271a, a second portion 271b that is disposed on a side opposite to the movable mirror 22 with respect to the first portion 271a, and a third portion 271c that is connected to the first portion 271a and the second portion 271b. The first portion 271a and the second portion 271b extend in the X-axis direction. A length of the first portion 271a in the X-axis direction is shorter than a length of the second portion 271b in the X-axis direction. The third portions 271c of the pair of levers 271 obliquely extend to be spaced away from each other as going away from the movable mirror 22.

The first link member 272 bridges first ends 271d of the pair of levers 271 on a side opposite to the movable mirror 22. The first link member 272 has a plate shape that extends along a plane perpendicular to the Z-axis direction, and extends in the Y-axis direction. The second link member 273 bridges second ends 271e of the pair of levers 271 on the movable mirror 22 side. The second link member 273 has a plate shape that extends along a plane perpendicular to the Z-axis direction, and extends in the Y-axis direction. A width of the second link member 273 in the X-axis direction is narrower than a width of the first link member 272 in the X-axis direction. A length of the second link member 273 in the Y-axis direction is shorter than a length of the first link member 272 in the Y-axis direction.

The pair of beam members 274 respectively bridge the second portions 271b of the pair of levers 271 and the first link member 272. The respective beam members 274 have a plate shape that extends along a plane perpendicular to the Z-axis direction. The pair of beam members 274 obliquely extend to approach each other as going away from the movable mirror 22. The pair of levers 271, the first link member 272, the second link member 273, and the pair of beam members 274 define the light passage opening 25. The light passage opening 25 has a polygonal shape when viewed from the Z-axis direction. For example, the light passage opening 25 is a cavity (hole). Alternatively, a material having optical transparency with respect to the measurement light L0 and the laser light L10 may be disposed in the light passage opening 25.

The intermediate member 275 has a plate shape that extends along a plane perpendicular to the Z-axis direction, and extends in the Y-axis direction. The intermediate member 275 is disposed between the movable mirror 22 and the second link member 273 (in other words, between the movable mirror 22 and the light passage opening 25). The intermediate member 275 is connected to the movable mirror 22 through the non-linearity mitigation springs 278 as to be described later.

The pair of first torsion bars 276 respectively bridge the first end 271d of one lever 271 and the base 21, and the first end 271d of the other lever 271 and the base 21. That is, the pair of first torsion bars 276 are respectively connected between the pair of levers 271 and the base 21. The first torsion bars 276 extend in the Y-axis direction. The pair of first torsion bars 276 are disposed on the same central line parallel to the Y-axis direction. In this embodiment, the central line of the first torsion bars 276 and the central line of the first link member 272 are located on the same straight line. A protrusion 271f that protrudes outward in the Y-axis direction is provided in each of the first ends 271d of the levers 271, and each of the first torsion bars 276 is connected to the protrusion 271f.

The pair of second torsion bars 277 respectively bridge the second end 271e of one lever 271 and one end of the intermediate member 275, and the second end 271e of the other lever 271 and the other end of the intermediate member 275. That is, the pair of second torsion bars 277 are respectively connected between the pair of levers 271 and the movable mirror 22. The respective second torsion bars 277 extend in the Y-axis direction. The pair of second torsion bars 277 are disposed on the same central line parallel to the Y-axis direction.

The pair of non-linearity mitigation springs 278 are connected between the movable mirror 22 and the intermediate member 275.

That is, the pair of non-linearity mitigation springs 278 are connected between the movable mirror 22 and the second torsion bar 277. Each of the non-linearity mitigation springs 278 includes a meandering portion 278a that extends in a meandering manner when viewed from the Z-axis direction. The meandering portion 278a includes a plurality of straight portions 278b which extend in the Y-axis direction and are aligned in the X-axis direction, and a plurality of folded portions 278c which alternately connect both ends of the plurality of straight portions 278b. One end of the meandering portion 278a is connected to the intermediate member 275, and the other end of the meandering portion 278a is connected to the frame portion 222. In the meandering portion 278a, a portion on the frame portion 222 side has a shape along the outer edge of the frame portion 222.

The non-linearity mitigation spring 278 is constituted as follows. In a state in which the movable mirror 22 has moved in the Z-axis direction, the amount of deformation of the non-linearity mitigation spring 278 around the Y-axis direction becomes smaller than the amount of deformation of each of the first torsion bar 276 and the second torsion bar 277 around the Y-axis direction, and the amount of deformation of the non-linearity mitigation spring 278 in the X-axis direction becomes larger than the amount of deformation of each of the first torsion bar 276 and the second torsion bar 277 in the X-axis direction. Accordingly, it is possible to suppress occurrence of non-linearity in twist deformation of the first torsion bar 276 and the second torsion bar 277, and it is possible to suppress deterioration of control characteristics of the movable mirror 22 due to the non-linearity.

The plurality of electrode support portions 279 includes a pair of first electrode support portions 279a, a pair of second electrode support portions 279b, and a pair of third electrode support portions 279c. Each of the electrode support portions 279a, 279b, and 279c has a plate shape that extends along a plane perpendicular to the Z-axis direction, and extends in the Y-axis direction. Each of the electrode support portions 279a, 279b, and 279c extends from the second portion 271b of the lever 271 toward a side opposite to the light passage opening 25. The pair of first electrode support portions 279a are disposed on the same central line parallel to the Y-axis direction. The pair of second electrode support portions 279b are disposed on the same central line parallel to the Y-axis direction. The pair of third electrode support portions 279c are disposed on the same central line parallel to the Y-axis direction. In the X-axis direction, the first electrode support portions 279a, the second electrode support portions 279b, and the third electrode support portions 279c are aligned in this order from the movable mirror 22 side.

The actuator unit 28 moves the movable mirror 22 in the Z-axis direction. The actuator unit 28 includes a fixed comb electrode 281, a movable comb electrode 282, a fixed comb electrode 283, and a movable comb electrode 284. Positions of the fixed comb electrodes 281 and 283 are fixed. The movable comb electrodes 282 and 284 move in accordance with movement of the movable mirror 22.

The fixed comb electrode 281 is provided on a part of a surface, which faces the electrode support portions 269, of the device layer 102 of the base 21. The fixed comb electrode 281 includes a plurality of fixed comb fingers 281a which extend along a plane perpendicular to the Y-axis direction. The fixed comb fingers 281a are aligned in the Y-axis direction with a predetermined gap therebetween.

The movable comb electrode 282 is provided on a surface of each of the first electrode support portions 269a on the movable mirror 22 side, on surfaces of each of the second electrode support portions 269b on both sides in the X-axis direction, and on a surface of each of the third electrode support portion 269c on the movable mirror 22 side. The movable comb electrode 282 includes a plurality of movable comb fingers 282a which extend along a plane perpendicular to the Y-axis direction. The movable comb fingers 282a are aligned in the Y-axis direction with a predetermined gap therebetween.

In the fixed comb electrode 281 and the movable comb electrode 282, the plurality of fixed comb fingers 281a and the plurality of movable comb fingers 282a are alternately arranged. That is, each of the fixed comb fingers 281a of the fixed comb electrode 281 is located between the movable comb fingers 282a of the movable comb electrode 282. The fixed comb fingers 281a and the movable comb fingers 282a, which are adjacent to each other, face each other in the Y-axis direction. A distance between the fixed comb finger 281a and the movable comb finger 282a, which are adjacent to each other, is approximately several μm.

The fixed comb electrode 283 is provided on a part of a surface, which faces the electrode support portions 279, of the device layer 102 of the base 21. The fixed comb electrode 283 includes a plurality of fixed comb fingers 283a which extend along a plane perpendicular to the Y-axis direction. The fixed comb fingers 283a are aligned in the Y-axis direction with a predetermined gap therebetween.

The movable comb electrode 284 is provided on a surface of each of the first electrode support portion 279a on the movable mirror 22 side, on surfaces of each of the second electrode support portions 279b on both sides in the X-axis direction, and on a surface of each of the third electrode support portion 279c on the movable mirror 22 side. The movable comb electrode 284 includes a plurality of movable comb fingers 284a which extend along a plane perpendicular to the Y-axis direction. The movable comb fingers 284a are aligned in the Y-axis direction with a predetermined gap therebetween.

In the fixed comb electrode 283 and the movable comb electrode 284, the plurality of fixed comb fingers 283a and the plurality of movable comb fingers 284a are alternately arranged. That is, each of the fixed comb fingers 283a of the fixed comb electrode 283 is located between the movable comb fingers 284a of the movable comb electrode 284. The fixed comb fingers 283a and the movable comb fingers 284a, which are adjacent to each other, face each other in the Y-axis direction. For example, a distance between the fixed comb finger 283a and the movable comb finger 284a, which are adjacent to each other, is approximately several μm.

A plurality of electrode pads 211 are provided in the base 21. The electrode pads 211 are disposed on a surface of the device layer 102 in an opening 213 formed in the first surface 21a of the base 21 to reach the device layer 102. Some of the plurality of electrode pads 211 are electrically connected to the fixed comb electrode 281 or the fixed comb electrode 283 via the device layer 102. Several other electrode pads 211 among the plurality of electrode pads 211 are electrically connected to the movable comb electrode 282 or the movable comb electrode 284 via the first elastic support unit 26 or the second elastic support unit 27. In addition, a pair of electrode pads 212 which can be used as ground electrodes are provided in the base 21. The pair of electrode pads 212 are disposed on the first surface 21a to be located on both sides of the movable mirror 22 in the Y-axis direction.

A configuration of the periphery of the electrode pads 211 will be described with reference to FIG. 11. Hereinafter, description will be made with reference to one electrode pad 211, but other electrode pads 211 also have the same configuration. As illustrated in FIG. 11, each of the electrode pads 211 is disposed on a surface 102a of the device layer 102 on one side in the Z-axis direction in an opening 213 formed in a surface 101a of the support layer 101 on one side in the Z-axis direction to reach the device layer 102.

The opening 213 includes a bottom surface 214 constituted by the surface 102a, and a lateral surface 215 constituted by the support layer 101 and the intermediate layer 103. For example, the bottom surface 214 has a rectangular shape. The lateral surface 215 includes a first surface 215a that extends continuously from the bottom surface 214 and approximately vertically to the bottom surface 214, a stepped surface 215b that extends continuously from the first surface 215a and in approximately parallel to the bottom surface 214, and a second surface 215c that extends continuously from the stepped surface 215b and approximately vertically to the bottom surface 214. The stepped surface 215b extends in an annular shape along an edge of the opening 213 when viewed from the Z-axis direction.

The electrode pad 211 is disposed along an entire surface of the bottom surface 214. In addition, the electrode pad 211 extends along the bottom surface 214 and the lateral surface 215. More specifically, the electrode pad 211 is formed so that the electrode pad 211 reaches the first surface 215a of the lateral surface 215 and does not reach the stepped surface 215b of the lateral surface 215. For example, the electrode pad 211 is constituted by a metal film (metal layer). For example, the metal film is formed by sputtering using a hard mask. The metal film that constitutes the electrode pad 211 is thicker than a metal film that constitutes the mirror surface 22a.

The base 21 includes a groove 216 that is formed in the surface 101a of the support layer 101 to reach the device layer 102. The groove 216 extends in an annular shape to surround the opening 213 when viewed from the Z-axis direction. For example, the groove 216 has a rectangular shape when viewed from the Z-axis direction. Because the groove 216 is formed, it is possible to reliably electrically insulate the electrode pads 211 from each other. That is, as in this embodiment, in a case where the metal film that constitutes the electrode pad 211 is formed to reach the lateral surface 215, and the electrode pad 211 is in contact with the support layer 101, there is a concern that the electrode pads 211 may be electrically connected to each other through the support layer 101. In contrast, in the mirror device 20, because the groove 216 is provided, even in the above-described case, it is possible to reliably electrically insulate the electrode pads 211 from each other.

In the mirror device 20 configured as described above, an electric signal for moving the movable mirror 22 in the Z-axis direction, is input to the drive unit 23 through a lead pin 113 to be described later and a wire (not illustrated). Accordingly, for example, an electrostatic force is generated between the fixed comb electrode 281 and the movable comb electrode 282 which face each other, and the fixed comb electrode 283 and the movable comb electrode 284 which face each other so that the movable mirror 22 moves to one side in the Z-axis direction. At this time, the first torsion bars 266 and 276 and the second torsion bars 267 and 277 in the first elastic support unit 26 and the second elastic support unit 27 are twisted, and an elastic force is generated in the first elastic support unit 26 and the second elastic support unit 27. In the mirror device 20, when a periodic electric signal is applied to the drive unit 23, it is possible to reciprocate the movable mirror 22 in the Z-axis direction at a resonance frequency level. In this manner, the drive unit 23 functions as an electrostatic actuator.

[Another Configuration of Mirror Unit]

As illustrated in FIG. 2, FIG. 3, FIG. 4, and FIG. 7, the optical function member 13 includes the third surface 13a (a surface on the one side in the Z-axis direction) that faces the second surface 21b of the base 21, and a fourth surface 13b opposite to the third surface 13a. The optical function member 13 is disposed on the other side in the Z-axis direction with respect to the mirror device 20. When viewed from the Z-axis direction, an outer edge 13c of the optical function member 13 is located outside of an outer edge 21c of the base 21. That is, when viewed from the Z-axis direction, the outer edge 13c of the optical function member 13 surrounds the outer edge 21c of the base 21. The optical function member 13 is integrally formed by a material having transparency with respect to the measurement light L0 and the laser light L10. For example, the optical function member 13 is formed in a rectangular plate shape by glass, and has a size of approximately 15 mm×20 mm×4 mm (thickness). For example, the material of the optical function member 13 is selected in accordance with a sensitivity wavelength of the optical module 1. For example, the material is set to glass in a case where the sensitivity wavelength of the optical module 1 is a near infrared region, and the material is set to silicon in a case where the sensitivity wavelength of the optical module 1 is an intermediate infrared region.

A pair of light transmitting portions 14 and 15 are provided in the optical function member 13. The light transmitting portion 14 is a portion, which faces the light passage opening 24 of the mirror device 20 in the Z-axis direction, in the optical function member 13. The light transmitting portion 15 is a portion, which faces the light passage opening 25 of the mirror device 20 in the Z-axis direction, in the optical function member 13. A surface 14a of the light transmitting portion 14 on the mirror device 20 side, and a surface 15a of the light transmitting portion 15 on the mirror device 20 side are located on the same plane as the third surface 13a. The light transmitting portion (second light passage portion) 14 constitutes a second portion (partial portion) of an optical path between the beam splitter unit 3 and the fixed mirror 16. The light transmitting portion 14 is a portion that corrects an optical path difference that occurs between an optical path between the beam splitter unit 3 and the movable mirror 22, and an optical path between the beam splitter unit 3 and the fixed mirror 16. In this embodiment, the light transmitting portion 15 does not function as a light transmitting portion.

The optical function member 13 includes a fifth surface 13d that faces the movable mirror 22 and the drive unit 23 of the mirror device 20. The fifth surface 13d is located on the fourth surface 13b side in comparison to the third surface 13a. The fifth surface 13d extends to the outer edge 13c of the optical function member 13 when viewed from the Z-axis direction. In this embodiment, the fifth surface 13d extends to a pair of opposite sides which extend in the Y-axis direction in the outer edge 13c of the optical function member 13 while surrounding ends of the respective light transmitting portions 14 and 15 on the mirror device 20 side.

The third surface 13a of the optical function member 13 is joined to the second surface 21b of the base 21 by direct bonding (for example, plasma activation bonding, surface-activated room-temperature bonding (SAB), atomic diffusion bonding (ADB), anodic bonding, fusion bonding, hydrophilic bonding, and the like). In this embodiment, the third surface 13a extends to face a plurality of the electrode pads 211 and 212 provided in the base 21 on both sides of the fifth surface 13d in the Y-axis direction. Here, the fifth surface 13d is located on the fourth surface 13b side in comparison to the third surface 13a, and thus the fifth surface 13d is separated from the mirror device 20 in a region where the fifth surface 13d faces the movable mirror 22 and the drive unit 23. In addition, the surface 14a of the light transmitting portion 14 and the surface 15a of the light transmitting portion 15 respectively face the light passage openings 24 and 25 of the mirror device 20. Accordingly, in the mirror unit 2, when the movable mirror 22 reciprocates in the Z-axis direction, the movable mirror 22 and the drive unit 23 are prevented from coming into contact with the optical function member 13.

A sixth surface 21d, which is separated from the optical function member 13 in a state in which the third surface 13a of the optical function member 13 and the second surface 21b of the base 21 are joined to each other, is provided in the base 21 of the mirror device 20. The sixth surface 21d is separated from the optical function member 13 in a region that includes at least a part of an outer edge of the base 21 when viewed from the Z-axis direction. In this embodiment, the sixth surface 21d is formed by removing the device layer 102 and the intermediate layer 103 along one side, which extends in the Y-axis direction, in the outer edge of the base 21 by etching. In addition, a plurality of reference holes 13e are formed in the third surface 13a of the optical function member 13. In this embodiment, the plurality of reference holes 13e are formed in the third surface 13a to correspond to a plurality of corners of the base 21. When the third surface 13a of the optical function member 13 and the second surface 21b of the base 21 are joined to each other, handling of the mirror device 20 is performed in a state in which a portion of the base 21 which corresponds to the sixth surface 21d is gripped, and thus a position of the mirror device 20 in the X-axis direction and the Y-axis direction, and an angle of the mirror device 20 in a horizontal plane perpendicular to the Z-axis direction are adjusted based on of the plurality of reference holes 13e formed in the third surface 13a.

As illustrated in FIG. 3 and FIG. 4, the fixed mirror 16 is disposed on the other side (side opposite to the mirror device 20) in the Z-axis direction with respect to the optical function member 13, and a position of the mirror device 20 with respect to the base 21 is fixed. For example, the fixed mirror 16 is formed on the fourth surface 13b of the optical function member 13 by vapor deposition. The fixed mirror 16 includes a mirror surface 16a perpendicular to the Z-axis direction. In this embodiment, the mirror surface 22a of the movable mirror 22, and the mirror surface 16a of the fixed mirror 16 face one side (beam splitter unit 3 side) in the Z-axis direction. The fixed mirror 16 is formed continuously with the fourth surface 13b of the optical function member 13 to reflect light that is transmitted through the respective light transmitting portions 14 and 15 of the optical function member 13. However, a fixed mirror that reflects light transmitted through the light transmitting portion 14, and a fixed mirror that reflects light transmitted through the light transmitting portion 15 may be provided, respectively.

The stress mitigation substrate 17 is attached to the fourth surface 13b of the optical function member 13 via the fixed mirror 16. For example, the stress mitigation substrate 17 is attached to the fixed mirror 16, for example, by an adhesive. When viewed from the Z-axis direction, an outer edge of the stress mitigation substrate 17 is located outside of the outer edge 13c of the optical function member 13. That is, when viewed from the Z-axis direction, the outer edge of the stress mitigation substrate 17 surrounds the outer edge 13c of the optical function member 13. A thermal expansion coefficient of the stress mitigation substrate 17 is closer to a thermal expansion coefficient of the base 21 of the mirror device 20 (more specifically, a thermal expansion coefficient of the support layer 101) in comparison to a thermal expansion coefficient of the optical function member 13. In addition, the thickness of the stress mitigation substrate 17 is closer to the thickness of the base 21 of the mirror device 20 in comparison to the thickness of the optical function member 13. For example, the stress mitigation substrate 17 is formed in a rectangular plate shape by silicon, and has a size of approximately 16 mm×21 mm×0.65 mm (thickness).

Figure 8:
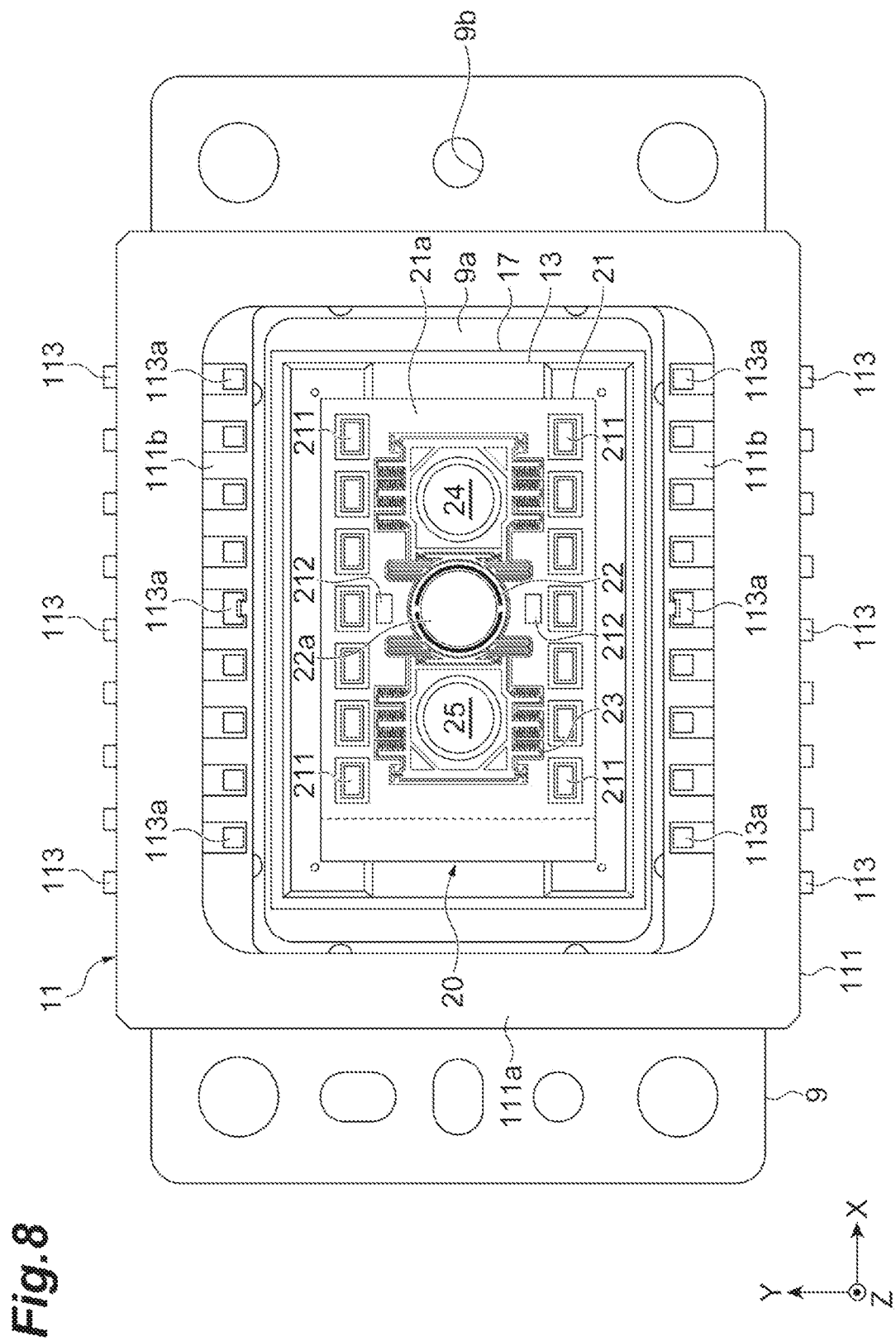
FIG. 8 is a cross-sectional view of the optical module which is taken along line VIII-VIII illustrated in FIG. 1.

As illustrated in FIG. 1, the mirror unit 2 configured as described above is attached to the support 9 by fixing a surface of the stress mitigation substrate 17 on a side opposite to the optical function member 13 to a surface 9a of the support 9 (surface on the one side in the Z-axis direction), for example, by an adhesive. When the mirror unit 2 is attached to the support 9, as illustrated in FIG. 8, a position of the mirror device 20 in the X-axis direction and the Y-axis direction and an angle of the mirror device 20 in a horizontal plane perpendicular to the Z-axis direction are adjusted based on a reference hole 9b that is formed in the support 9. In FIG. 8, the second support structure 12 is not illustrated.

[Configuration of First Support Structure and Beam Splitter Unit]

As illustrated in FIG. 1 and FIG. 8, the first support structure 11 includes a frame body 111, a light transmitting member 112, and a plurality of lead pins 113. The frame body 111 is formed so as to surround the mirror unit 2 when viewed from the Z-axis direction, and is attached to the surface 9a of the support 9, for example, by an adhesive such as silver solder. For example, the frame body 111 is formed of ceramic, and has a rectangular frame shape. An end surface 111a of the frame body 111 on a side opposite to the support 9 is located on a side opposite to the support 9 in comparison to the first surface 21a of the base 21 of the mirror device 20.

The light transmitting member 112 is formed so as to close an opening of the frame body 111, and is attached to the end surface 111a of the frame body 111, for example, with an adhesive. The light transmitting member 112 is formed of a material having transparency with respect to the measurement light L0 and the laser light L10, and has a rectangular plate shape for example. Here, the end surface 111a of the frame body 111 is located on a side opposite to the support 9 in comparison to the first surface 21a of the base 21 of the mirror device 20, and thus the light transmitting member 112 is separated from the mirror device 20. Accordingly, in the optical module 1, when the movable mirror 22 reciprocates in the Z-axis direction, the movable mirror 22 and the drive unit 23 are prevented from coming into contact with the light transmitting member 112. In the optical module 1, the support 9, the frame body 111, and the light transmitting member 112 constitute a package that accommodates the mirror unit 2.

The respective lead pins 113 are provided in the frame body 111 in such a manner that one end 113a is located inside of the frame body 111, and the other end (not illustrated) is located outside of the frame body 111. The one ends 113a of the lead pins 113 are electrically connected to the electrode pads 211 and 212 corresponding to the lead pins 113 in the mirror device 20 by wires (not illustrated). In the optical module 1, an electric signal for moving the movable mirror 22 in the Z-axis direction is input to the drive unit 23 through the plurality of lead pins 113. In this embodiment, a stepped surface 111b that extends in the X-axis direction on both sides of the optical function member 13 in the Y-axis direction is formed in the frame body 111, and one end 113a of each of the lead pins 113 is disposed on the stepped surface 111b. The lead pin 113 extends in the Z-axis direction on both sides of the support 9 in the Y-axis direction, and the other end of the lead pin 113 is located on the other side in the Z-axis direction in comparison to the support 9.

Figure 10:
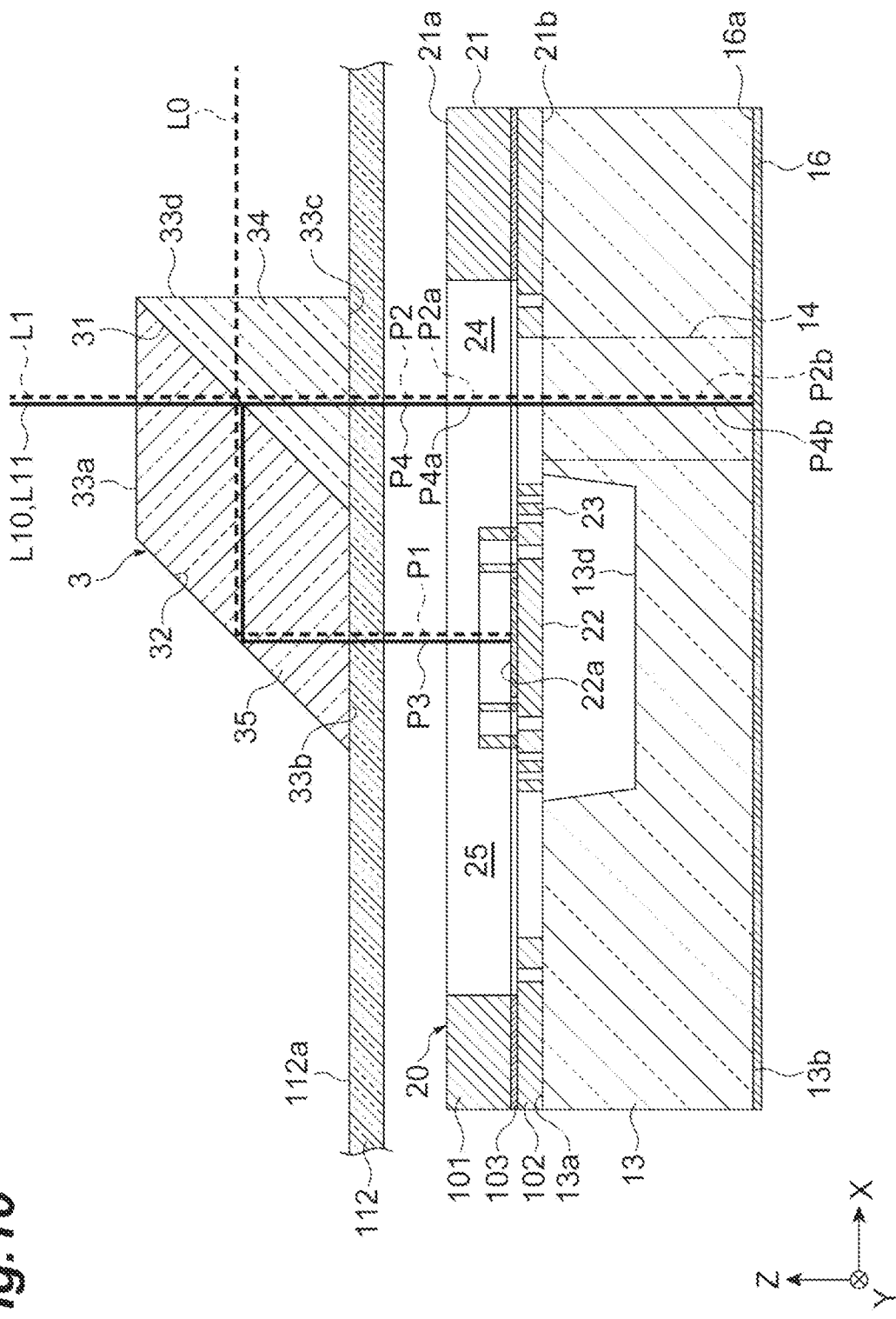
FIG. 10 is a schematic cross-sectional view of the mirror unit and a beam splitter unit which are illustrated in FIG. 1.

As illustrated in FIG. 10, the beam splitter unit 3 is attached to a surface 112a of the light transmitting member 112 on a side opposite to the mirror device 20, for example, by an optical adhesive that also functions as a refractive index matching agent. The beam splitter unit 3 includes a first mirror surface 31, a second mirror surface 32, and a plurality of optical surfaces 33a, 33b, 33c, and 33d. The beam splitter unit 3 is constituted by joining a plurality of optical blocks 34 and 35. The respective optical blocks 34 and 35 are formed of a material having a refractive index that is the same as or similar to that of the optical function member 13. FIG. 10 is a schematic cross-sectional view of the mirror unit 2 and the beam splitter unit 3 illustrated in FIG. 1, and in FIG. 10, the mirror device 20 is schematically illustrated, for example, in a state in which dimensions in the Z-axis direction are enlarged in comparison to actual dimensions.

The first mirror surface 31 is a mirror surface (for example, a half mirror surface) that is inclined with respect to the Z-axis direction, and is formed between the optical block 34 and the optical block 35. In this embodiment, the first mirror surface 31 is a surface that is parallel to the Y-axis direction, has an angle of 45° with respect to the Z-axis direction, and is inclined to be spaced away from the light incident unit 4 as it approaches the mirror device 20. The first mirror surface 31 has a function of reflecting a part of the measurement light L0 and allowing the remainder of the measurement light L0 to be transmitted therethrough, and a function of reflecting a part of the laser light L10 and allowing the remainder of the laser light L10 to be transmitted therethrough. For example, the first mirror surface 31 is formed of a dielectric multi-layer film. The first mirror surface 31 overlaps the light passage opening 24 of the mirror device 20, the light transmitting portion 14 of the optical function member 13, and the mirror surface 16a of the fixed mirror 16 when viewed from the Z-axis direction, and overlaps the light incident unit 4 when viewed form the X-axis direction (refer to FIG. 1). That is, the first mirror surface 31 faces the fixed mirror 16 in the Z-axis direction, and faces the light incident unit 4 in the X-axis direction.

The second mirror surface 32 is a mirror surface (for example, a total reflection mirror surface) that is parallel to the first mirror surface 31, and is formed in the optical block 35 to be located on a side opposite to the light incident unit 4 with respect to the first mirror surface 31. The second mirror surface 32 has a function of reflecting the measurement light L0 and a function of reflecting the laser light L10. For example, the second mirror surface 32 is formed of a metal film. The second mirror surface 32 overlaps the mirror surface 22a of the movable mirror 22 of the mirror device 20 when viewed from the Z-axis direction, and overlaps the first mirror surface 31 when viewed from the X-axis direction. That is, the second mirror surface 32 faces the movable mirror 22 in the Z-axis direction, and faces the first mirror surface 31 in the X-axis direction.

The optical surface 33a is a surface perpendicular to the Z-axis direction, and is formed in the optical block 35 to be located on a side opposite to the mirror device 20 with respect to the first mirror surface 31. The optical surface 33b is a surface perpendicular to the Z-axis direction, and is formed in the optical block 35 to be located on the mirror device 20 side with respect to the second mirror surface 32. The optical surface 33*c* is a surface perpendicular to the Z-axis direction, and is formed in the optical block 34 to be located on the mirror device 20 side with respect to the first mirror surface 31. The optical surface 33*b* and the optical surface 33*c* are located on the same plane. The optical surface 33*d* is a surface perpendicular to the X-axis direction, and is formed in the optical block 34 to be located on the light incident unit 4 side with respect to the first mirror surface 31. The respective optical surfaces 33*a*, 33*b*, 33*c*, and 33*d* have a function of allowing the measurement light L0 to be transmitted therethrough, and a function of allowing the laser light L10 to be transmitted therethrough.

Figure 9:
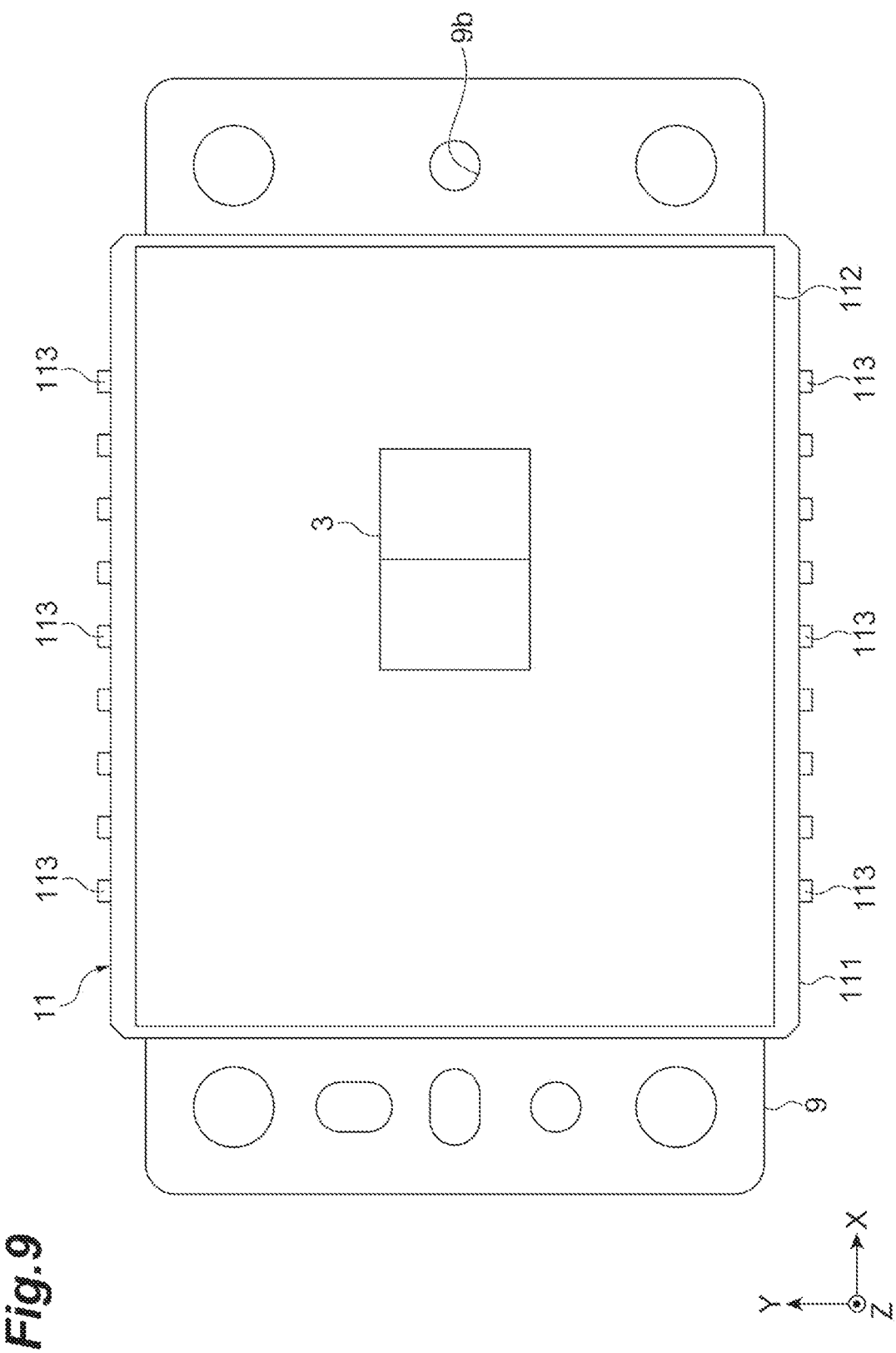
FIG. 9 is a cross-sectional view of the optical module which is taken along line IX-IX illustrated in FIG. 1.

The beam splitter unit 3 configured as described above is attached to the light transmitting member 112 by fixing the optical surface 33*b* and the optical surface 33*c* which are located on the same plane to the surface 112*a* of the light transmitting member 112, for example, by an optical adhesive. When the beam splitter unit 3 is attached to the light transmitting member 112, as illustrated in FIG. 9, a position of the beam splitter unit 3 in the X-axis direction and the Y-axis direction, and an angle of the beam splitter unit 3 in a horizontal plane perpendicular to the Z-axis direction are adjusted based on the reference hole 9*b* formed in the support 9. In FIG. 9, the second support structure 12 is not illustrated.

Here, the optical path of the measurement light L0 and the optical path of the laser light L10 in the mirror unit 2 and the beam splitter unit 3 will be described in detail with reference to FIG. 10.

As illustrated in FIG. 10, when the measurement light L0 is incident to the beam splitter unit 3 in the X-axis direction through the optical surface 33*d*, a part of the measurement light L0 is transmitted through the first mirror surface 31, is reflected by the second mirror surface 32, and reaches the mirror surface 22*a* of the movable mirror 22 through the optical surface 33*b* and the light transmitting member 112. The part of the measurement light L0 is reflected by the mirror surface 22*a* of the movable mirror 22, and proceeds on the same optical path P1 in an opposite direction, and is reflected by the first mirror surface 31. The remainder of the measurement light L0 is reflected by the first mirror surface 31, and reaches the mirror surface 16*a* of the fixed mirror 16 through the optical surface 33*c*, the light transmitting member 112, the light passage opening 24 of the mirror device 20, and the light transmitting portion 14 of the optical function member 13. The remainder of the measurement light L0 is reflected by the mirror surface 16*a* of the fixed mirror 16, proceeds on the same optical path P2 in an opposite direction, and is transmitted through the first mirror surface 31. The part of the measurement light L0 which is reflected by the first mirror surface 31, and the remainder of the measurement light L0 which is transmitted through the first mirror surface 31 become interference light L1, and the interference light L1 of the measurement light is emitted from the beam splitter unit 3 through the optical surface 33*a* along the Z-axis direction.

On the other hand, when the laser light L10 is incident to the beam splitter unit 3 in the Z-axis direction through the optical surface 33*a*, a part of the laser light L10 is reflected by the first mirror surface 31 and the second mirror surface 32, and reaches the mirror surface 22*a* of the movable mirror 22 through the optical surface 33*b* and the light transmitting member 112. The part of the laser light L10 is reflected by the mirror surface 22*a* of the movable mirror 22, proceeds on the same optical path P3 in an opposite direction, and is reflected by the first mirror surface 31. The remainder of the laser light L10 is transmitted through the first mirror surface 31, and reaches the mirror surface 16*a* of the fixed mirror 16 through the optical surface 33*c*, the light transmitting member 112, the light passage opening 24 of the mirror device 20, and the light transmitting portion 14 of the optical function member 13. The remainder of the laser light L10 is reflected by the mirror surface 16*a* of the fixed mirror 16, proceeds on the same optical path P4 in an opposite direction, and is transmitted through the first mirror surface 31. The part of the laser light L10 which is reflected by the first mirror surface 31, and the remainder of the laser light L10 which is transmitted through the first mirror surface 31 become interference light L11, and the interference light L11 of the laser light is emitted from the beam splitter unit 3 through the optical surface 33*a* along the Z-axis direction.

As described above, the light passage opening 24 of the mirror device 20 constitutes a first portion P2*a* of the optical path P2 of the measurement light L0 and a first portion P4*a* of the optical path P4 of the laser light L10 in an optical path between the beam splitter unit 3 and the fixed mirror 16. In addition, the light transmitting portion 14 of the optical function member 13 constitutes a second portion P2*b* of the optical path P2 of the measurement light L0 and a second portion P4*b* of the optical path P4 of the laser light L10 in the optical path between the beam splitter unit 3 and the fixed mirror 16.

The second portion P2*b* of the optical path P2 of the measurement light L0 is constituted by the light transmitting portion 14, thus an optical path difference between both the optical paths P1 and P2 is corrected so that a difference between an optical path length (optical path length in consideration of a refractive index of respective media through which the optical path passes) of the optical path P1 of the measurement light L0, and an optical path length of the optical path P2 of the measurement light L0 decreases. Similarly, the second portion P4*b* of the optical path P4 of the laser light L10 is constituted by the light transmitting portion 14, thus an optical path difference between both the optical paths P3 and P4 is corrected so that a difference between an optical path length of the optical path P3 of the laser light L10 and an optical path length of the optical path P4 of the laser light L10 decreases. In this embodiment, a refractive index of the light transmitting portion 14 is the same as a refractive index of the respective optical blocks which constitute the beam splitter unit 3, and a distance between the first mirror surface 31 and the second mirror surface 32 in the X-axis direction is the same as the thickness of the light transmitting portion 14 in the Z-axis direction (that is, a distance between the surface 14*a* of the light transmitting portion 14 and the fourth surface 13*b* of the optical function member 13 in the Z-axis direction).

[Configuration of Second Support Structure, Light Incident Unit, and the Like]

As illustrated in FIG. 1, the second support structure 12 includes a connection unit 120. The connection unit 120 includes a main body portion 121, a frame body 122, and a fixing plate 123. The main body portion 121 includes a pair of side wall portions 124 and 125, and a ceiling wall portion 126. The pair of side wall portions 124 and 125 face each other in the X-axis direction. An opening 124*a* is formed in the side wall portion 124 on one side in the X-axis direction. The ceiling wall portion 126 faces the support 9 in the Z-axis direction. An opening 126*a* is formed in the ceiling wall portion 126. For example, the main body portion 121 is integrally formed of a metal. A plurality of positioning pins 121*a* are provided in the main body portion 121. The main body portion 121 is positioned with respect to the support 9 by inserting the positioning pins 121*a* into the reference hole 9*b* and the hole 9*c* which are formed in the support 9, and is attached to the support 9 in this state, for example, by a bolt.

The frame body 122 is disposed on a surface of the side wall portion 124 on a side opposite to the beam splitter unit 3. An opening of the frame body 122 faces the beam splitter unit 3 through the opening 124*a* of the side wall portion 124. The light incident unit 4 is disposed in the frame body 122. The fixing plate 123 is a member that fixes the light incident unit 4 disposed in the frame body 122 to the main body portion 121 (details will be described later).

The second support structure 12 further includes a holding unit 130. The holding unit 130 includes a main body portion 131, a frame body 132 and a fixing plate 133. The main body portion 131 is attached to a surface of the ceiling wall portion 126 which is opposite to the support 9. The main body portion 131 is positioned with respect to the main body portion 121 of the connection unit 120 by a plurality of positioning pins 131*a*, and is attached to the ceiling wall portion 126 in this state, for example, by a bolt. A concave portion 134 is formed in a surface of the main body portion 131 which is opposite to the support 9. A first light passage hole 135, a second light passage hole 136, and a third light passage hole 137 are formed in a bottom surface of the concave portion 134. The first light passage hole 135 is formed at a position that faces the first mirror surface 31 of the beam splitter unit 3 in the Z-axis direction. The second light passage hole 136 is formed on the other side of the first light passage hole 135 in the X-axis direction (that is, on a side opposite to the light incident unit 4). The third light passage hole 137 is formed on the other side of the second light passage hole 136 in the X-axis direction.

The frame body 132 is disposed on the bottom surface of the concave portion 134. An opening of the frame body 132 faces the third light passage hole 137. The second light source 7 is disposed in the frame body 132. The first light detector 6 is disposed on the bottom surface of the concave portion 134 in a state of facing the first light passage hole 135. The second light detector 8 is disposed on the bottom surface of the concave portion 134 in a state of facing the second light passage hole 136. The fixing plate 133 is a member that fixes the first light detector 6 and the second light detector 8 which are disposed on the bottom surface of the concave portion 134, and the second light source 7 that is disposed in the frame body 132 to the main body portion 131 (details will be described later).

The light incident unit 4 includes a holder 41 and a collimator lens 42. The holder 41 holds the collimator lens 42, and is configured so that an optical fiber (not illustrated) that guides the measurement light L0 can be connected to the holder 41. The collimator lens 42 collimates the measurement light L0 emitted from the optical fiber. When the optical fiber is connected to the holder 41, an optical axis of the optical fiber matches an optical axis of the collimator lens 42.

A flange portion 41*a* is provided in the holder 41. The flange portion 41*a* is disposed between the frame body 122 and the fixing plate 123. In this state, fixing plate 123 is attached to the side wall portion 124, for example, by a bolt, and the light incident unit 4 disposed in the frame body 122 is fixed to the main body portion 121. In this manner, the light incident unit 4 is disposed on one side of the beam splitter unit 3 in the X-axis direction, and is supported by the second support structure 12. The light incident unit 4 allows measurement light L0 that is incident from the first light source through a measurement target or measurement light L0 that is generated from the measurement target (in this embodiment, the measurement light L0 guided by the optical fiber) to be incident to the beam splitter unit 3.

A filter 54 is attached to the frame body 122. The filter 54 has a function of cutting off the laser light L10. The filter 54 is disposed in the opening 124*a* of the side wall portion 124 in a state of being inclined with respect to an optical axis of the light incident unit 4. The filter 54 closes the opening of the frame body 122 when viewed form the X-axis direction. In this manner, the filter 54 is disposed between the light incident unit 4 and the beam splitter unit 3, and is supported by the second support structure 12 in a state of being inclined with respect to an optical axis of the light incident unit 4. In this embodiment, an optical surface of the filter 54 is a surface that is parallel to the Z-axis direction and has an angle of 10° to 20° with respect to the Y-axis direction. The optical axis of the light incident unit 4 is parallel to the X-axis direction.

Accordingly, even when light in the same wavelength range as the laser light L10 is included in the measurement light L0, the light is prevented from being incident to the beam splitter unit 3, and thus it is possible to obtain a position of the movable mirror 22 in the Z-axis direction with accuracy based on a detection result of the interference light L11 of the laser light. In addition, because the filter 54 is inclined with respect to the optical axis of the light incident unit 4, light in the same wavelength range as the laser light L10 is reflected to the outside of an interference optical system, and thus it is possible to reliably prevent the light from being stray light. In this embodiment, light in the same wavelength range as the laser light L10 emitted from the beam splitter unit 3 in the X-axis direction is reflected by the filter 54, and is emitted to the outside of the interference optical system from between the pair of side wall portions 124 and 125 in the main body portion 121 of the second support structure 12. Accordingly, it is possible to reliably prevent the light from being stray light.

The first light detector 6 includes a holder 61, a light detection element 62, and a condensing lens 63. The holder 61 holds the light detection element 62 and the condensing lens 63. The light detection element 62 detects the interference light L1 of the measurement light. For example, the light detection element 62 is an InGaAs photodiode. The condensing lens 63 condenses the interference light L1 of the measurement light incident to the light detection element 62 to the light detection element 62. In the holder 61, an optical axis of the light detection element 62 and an optical axis of the condensing lens 63 match each other.

A flange portion 61*a* is provided in the holder 61. The flange portion 61*a* is disposed between the bottom surface of the concave portion 134 of the main body portion 131, and the fixing plate 133. In this state, the fixing plate 133 is attached to the main body portion 131, for example, by a bolt, and thus the first light detector 6 disposed on the bottom surface of the concave portion 134 is fixed to the main body portion 131. In this manner, the first light detector 6 is disposed on one side of the beam splitter unit 3 in the Z-axis direction, and is supported by the second support structure 12. The first light detector 6 faces the first mirror surface 31 of the beam splitter unit 3 in the Z-axis direction. The first light detector 6 detects the interference light L1 of the measurement light emitted from the beam splitter unit 3.

The second light detector 8 includes a holder 81, a light detection element 82, and a condensing lens 83. The holder 81 holds the light detection element 82 and the condensing lens 83. The light detection element 82 detects the interference light L11 of the laser light. For example, the light detection element 82 is a Si photodiode. The condensing lens 83 condenses the interference light L11 of the laser light incident to the light detection element 82 to the light detection element 82. In the holder 81, an optical axis of the light detection element 82 and an optical axis of the condensing lens 83 match each other.

A flange portion 81a is provided in the holder 81. The flange portion 81a is disposed between the bottom surface of the concave portion 134 of the main body portion 131, and the fixing plate 133. In this state, the fixing plate 133 is attached to the main body portion 131, for example, by a bolt, and thus the second light detector 8 disposed on the bottom surface of the concave portion 134 is fixed to the main body portion 131. In this manner, the second light detector 8 is disposed on one side of the beam splitter unit 3 in the Z-axis direction, and is supported by the second support structure 12. The second light detector 8 detects the interference light L11 of the laser light emitted from the beam splitter unit 3.

The second light source 7 includes a holder 71, a light-emitting element 72, and a collimator lens 73. The holder 71 holds the light-emitting element 72 and the collimator lens 73. The light-emitting element 72 emits the laser light L10. For example, the light-emitting element 72 is a semiconductor laser such as a VCSEL. The collimator lens 73 collimates the laser light L10 emitted from the light-emitting element 72. In the holder 71, an optical axis of the light-emitting element 72 and an optical axis of the collimator lens 73 match each other.

A flange portion 71a is provided in the holder 71. The flange portion 71a is disposed between the frame body 132 and the fixing plate 133. In this state, the fixing plate 133 is attached to the main body portion 131, for example, by a bolt, and thus the second light source 7 disposed in the frame body 132 is fixed to the main body portion 131. In this manner, the second light source 7 is disposed on one side of the beam splitter unit 3 in the Z-axis direction, and is supported by the second support structure 12. The second light source 7 emits the laser light L10 that is to be incident to the beam splitter unit 3.

As described above, the holding unit 130 holds the first light detector 6, the second light detector 8, and the second light source 7 so that the first light detector (first optical device) 6, the second light detector (second optical device) 8, and the second light source (third optical device) 7 face the same side, and the first light detector 6, the second light detector 8, and the second light source 7 are aligned in this order. In this embodiment, on one side of the beam splitter unit 3 in the Z-axis direction, the holding unit 130 holds the first light detector 6, the second light detector 8, and the second light source 7 so that the first light detector 6, the second light detector 8, and the second light source 7 face the other side in the Z-axis direction (that is, the beam splitter unit 3 side). In addition, the holding unit 130 holds the first light detector 6, the second light detector 8, and the second light source 7 so that the first light detector 6, the second light detector 8, and the second light source 7 are aligned in this order from one side (that is, the light incident unit 4 side) in the X-axis direction.

A first mirror 51, a second mirror 52, and a third mirror 53 are attached to the main body portion 131 of the holding unit 130. The first mirror 51 is held by the holding unit 130 to be located on a side opposite to the first light detector 6 with respect to the first light passage hole 135. The second mirror 52 is held by the holding unit 130 to be located on a side opposite to the second light detector 8 with respect to the second light passage hole 136. The third mirror 53 is held by the holding unit 130 to be located on a side opposite to the second light source 7 with respect to the third light passage hole 137.

The first mirror 51 is a dichroic mirror that has a function of allowing the measurement light L0 to be transmitted therethrough and of reflecting the laser light L10, and is inclined with respect to the optical axis of the first light detector 6. The first mirror 51 is disposed between the beam splitter unit 3 and the first light detector 6. That is, the first mirror 51 is disposed to face the beam splitter unit 3 and the first light detector 6. In this embodiment, an optical surface of the first mirror 51 is a surface that is parallel to the Y-axis direction and has an angle of 45° with respect to the Z-axis direction. The optical axis of the first light detector 6 is parallel to the Z-axis direction.

The second mirror 52 is a mirror (for example, a half mirror) that has a function of reflecting a part of the laser light L10 and allowing the remainder of the laser light L10 to be transmitted therethrough, and is parallel to the first mirror 51. The second mirror 52 is disposed to overlap the first mirror 51 when viewed from the X-axis direction, and to overlap the second light detector 8 when viewed from the Z-axis direction. That is, the second mirror 52 is disposed to face the first mirror 51 and the second light detector 8. In this embodiment, an optical surface of the second mirror 52 is a surface that is parallel to the Y-axis direction, and has an angle of 45° with respect to the Z-axis direction.

The third mirror 53 is a mirror (for example, a total reflection mirror) that has a function of reflecting the laser light L10 and is parallel to the second mirror 52. The third mirror 53 is disposed to overlap the second mirror 52 when viewed from the X-axis direction, and overlap the second light source 7 when viewed from the Z-axis direction. That is, the third mirror 53 is disposed to face the second mirror 52 and the second light source 7. In this embodiment, an optical surface of the third mirror 53 is a surface that is parallel to the Y-axis direction, and has an angle of 45° with respect to the Z-axis direction.

An aperture 55 is attached to the main body portion 131 of the holding unit 130. The aperture 55 is held by the holding unit 130 to be located between the first mirror 51 and the first light detector 6. The aperture 55 is a member in which an opening having a circular shape is formed when viewed from the Z-axis direction, and is disposed in the first light passage hole 135.

The interference light L1 of the measurement light, which is emitted from the beam splitter unit 3 in the Z-axis direction, is transmitted through the first mirror 51, is incident to the first light detector 6 through the aperture 55, and is detected by the first light detector 6. On the other hand, the laser light L10 emitted from the second light source 7 is reflected by the third mirror 53, is transmitted through the second mirror 52, is reflected by the first mirror 51, and is incident to the beam splitter unit 3 in the Z-axis direction. The interference light L11 of the laser light, which is emitted from the beam splitter unit 3 in the Z-axis direction, is reflected by the first mirror 51 and the second mirror 52, is incident to the second light detector 8, and is detected by the second light detector 8.

Function and Effect

In the above-described mirror device 20, the first surface 21a of the base 21 (a surface on one side in the Z-axis direction) is located more to the one side than the mirror surface 22a. Accordingly, it is possible to protect the mirror surface 22a by the base 21 and it is possible to prevent the mirror surface 22a from being damaged, for example, due to direct contact in transportation or the like. In addition, in the mirror device 20, the support layer 101 that constitutes the base 21 is thicker than the device layer 102 that constitutes the base 21. Accordingly, it is possible to secure a protrusion amount of the base 21 with respect to the mirror surface 22a, and it is possible to effectively protect the mirror surface 22a by the base 21. Accordingly, according to the mirror device 20, it is possible to enhance reliability. A "configuration in which the first surface 21a of the base 21 is located more to the one side than the mirror surface 22a" represents that "at least a part of the first surface 21a is located more to the one side than the mirror surface 22a". In the mirror device 20, the entirety of the first surface 21a is located more to the one side in the Z-axis direction than the mirror surface 22a. In other words, the entirety of the mirror surface 22a is located more to the other side in the Z-axis direction than the first surface 21a. In other words, the "surface of the base on the one side in the Z-axis direction" is an "end surface of the base on the one side in the Z-axis direction" or a "surface located on the most one side in the Z-axis direction among surfaces of the base".

End surfaces (end surfaces 224as, 224bs, and 224cs) of the rib portion 224 on one side in the Z-axis direction are located more to the one side than the mirror surface 22a. Accordingly, it is also possible to protect the mirror surface 22a by the rib portion 224. In addition, it is also possible to suppress deformation of the movable unit 22b during movement by the rib portion 224.

The rib portion 224 includes the inner rib portion 224a that is disposed on a surface on one side in the arrangement portion 221 to extend along an outer edge of the arrangement portion 221 when viewed from the Z-axis direction. Accordingly, the inner rib portion 224a is disposed to be closer to the mirror surface 22a, and thus it is possible to more effectively protect the mirror surface 22a. In addition, the inner rib portion 224a is disposed on the arrangement portion 221, and thus it is possible to more appropriately suppress deformation of the arrangement portion 221.

The rib portion 224 includes the outer rib portion 224b that is disposed on a surface on one side in the frame portion 222 to extend along the frame portion 222 when viewed from the Z-axis direction. Accordingly, it is possible to more effectively protect the mirror surface 22a due to the rib portion 224. In addition, it is possible to suppress deformation of the frame portion 222 due to the outer rib portion 224b, and it is possible to suppress deformation of the arrangement portion 221 which is caused by deformation of the frame portion 222.

The support layer 101 that constitutes the rib portion 224 is thinner than the support layer 101 that constitutes the base 21. Accordingly, it is possible to suppress the rib portion 224 from protruding from the base 21 during movement of the movable unit 22b, and it is possible to increase a movement amount of the movable unit 22b in the Z-axis direction.

The groove 216 that reaches the device layer 102 from the surface 101a (surface on one side in the Z-axis direction) of the support layer 101 and extends to surround the opening 213 when viewed from the Z-axis direction is formed in the base 21. Accordingly, it is possible to reliably secure an electrical insulation property of the electrode pads 211 due to the groove 216, and it is possible to further enhance reliability.

The electrode pads 211 extend along the bottom surface 214 and the lateral surface 215 of the opening 213. Accordingly, it is possible to increase an area of the electrode pads 211. A metal layer that constitutes the electrode pads 211 is thicker than a metal layer that constitutes the mirror surface 22a. In this case, it is possible to suppress deformation of the mirror surface 22a, and it is possible to reliably secure electrical connection to the electrode pads 211. That is, bending of the mirror surface 22a is suppressed, and thus it is preferable that the metal layer that constitutes the mirror surface 22a is thin. Because the metal layer that constitutes the electrode pads 211 is thick, it is possible to enhance bonding performance in a wire bonding process. If the electrode pads 211 are excessively thin, there is a concern that it is difficult to provide a wire or a sufficient adhesive force is not obtained, but in the mirror device 20, it is possible to suppress the problem.

In the mirror unit 2, it is possible to correct an optical path length difference that occurs between the optical path between the beam splitter unit 3 and the movable mirror 22, and the optical path between the beam splitter unit 3 and the fixed mirror 16 due to the light transmitting portion 14 of the optical function member 13. "Correction of the optical path length difference" represents reduction of a difference between an optical path length of the optical path between the beam splitter unit 3 and the movable mirror 33 (optical path length in consideration of a refractive index of respective media through which the optical path passes), and an optical path length of the optical path between the beam splitter unit 3 and the fixed mirror 16. In addition, in the mirror unit 2, for example, the mirror surface 22a is disposed to be closer to the optical function member 13 in comparison to a "configuration in which the mirror surface 22a is disposed on a surface of the device layer 102 which is opposite to the intermediate layer 103, and the base 21 is joined to the third surface 13a of the optical function member 13 in a surface the support layer 101 which is opposite to the intermediate layer 103". This configuration is particularly effective for a case where the optical path length difference is corrected by the light transmitting portion 14. That is, for example, it is possible to align the reference position in the case of reciprocating the movable mirror 22 along the Z-axis direction to the third surface 13a of the optical function member 13 in an easy manner (in a small operation amount). Accordingly, it is possible to acquire sufficient optical interference signals while suppressing a reciprocation movement amount of the movable mirror 22 along the Z-axis direction.

Modification Example

In the above-described embodiment, materials and shapes of respective configurations are not limited to the above-described materials and shapes, and various materials and shapes can be employed. For example, each of the arrangement portion 221 and the mirror surface 22a may have any shape such as a rectangular shape and an octagonal shape when viewed from the Z-axis direction. The frame portion 222 may have any ring shape such as a rectangular ring shape and an octagonal ring shape when viewed from the Z-axis direction. Each of the light passage opening 24 and the light passage opening 25 may have any shape such as a circular shape and an octagonal shape when viewed from the Z-axis direction. The mirror device 20 may include a hole or a notch that is formed in the base 21 as a first light passage portion instead of the light passage opening 24 or the light passage opening 25. The semiconductor substrate that constitutes the mirror device 20 may not be the SOI substrate, and may be a substrate including a first semiconductor layer, an insulating layer, and a second semiconductor layer in this order from one side in the Z-axis direction.

Each of the inner rib portion 224a, the outer rib portion 224b, and the connection rib portion 224c (beam portions) may be formed in any shape. For example, the rib portions may extend obliquely with respect to X-axis direction or the Y-axis direction, or may extend in a zigzag shape. The arrangement, the number, the length, the width, and the thickness of the rib portions may be arbitrarily set. For example, the thicknesses of the inner rib portion 224a, the outer rib portion 224b, and the connection rib portion 224c may be different from each other. At least one of the rib portions may be omitted. The rib portion 224 may do not surround the mirror surface 22a when viewed from the Z-axis direction. The thickness of the support layer 101 that constitutes the rib portion 224 may be the same as the thickness of the support layer 101 that constitutes the base 21. The shape of the first torsion bars 266 and 276 and the second torsion bars 267 and 277 is not limited and may be any shape such as a rod shape. The electrode pads 211 may be disposed only on the bottom surface 214 of the opening 213, and may do not reach the lateral surface 215. In this case, the groove 216 may be omitted. The second surface 21b of the base 21 and the third surface 13a of the optical function member 13 may be joined to each other with means (for example, an adhesive such as a UV-curable resin) other than the direct bonding. In a case where the fixed mirror 16 is disposed on a side opposite to the mirror device 20 with respect to the optical function member 13, the fixed mirror 16 may be separated from the fourth surface 13b of the optical function member 13.

The optical device of the present disclosure is not limited to the mirror device, and may be an optical device in which another optical function unit other than the mirror surface 22a is disposed on the movable unit 22b. Examples of the other optical function unit include a lens and the like. The drive unit 23 of the mirror device 20 may include three or more elastic support portions which elastically support the movable mirror 22. The actuator unit 28 is not limited to the electrostatic actuator, and may be, for example, a piezoelectric type actuator, an electromagnetic type actuator, or the like. In the above-described embodiment, the movement direction (predetermined direction) of the movable unit 22b is a direction perpendicular to the first surface 21a of the base 21, but the movement direction may be any direction as long as the direction intersects the first surface 21a. The mirror device 20 is not limited to constitute the FTIR, and may constitute another optical system. The respective configurations in one embodiment or one modification example as described above can be arbitrarily applied to respective configurations in other embodiments or modification examples.

REFERENCE SIGNS LIST

3: beam splitter unit, 13: optical function member, 14: light transmitting portion (second light passage portion), 16: fixed mirror, 20: mirror device (optical device), 21: base, 21a: first surface (main surface), 21b: second surface (main surface), 22a: mirror surface (optical function unit), 22b: movable unit, 221: arrangement portion, 222: frame portion, 223: connection portion, 224: rib portion, 24: light passage opening (first light passage portion), 100: SOI substrate (semiconductor substrate), 101: support layer (first semiconductor layer), 101a: surface, 102: device layer (second semiconductor layer), 102a: surface, 103: intermediate layer (insulating layer), 211: electrode pad, 213: opening, 214: bottom surface, 215: lateral surface, 216: groove.

The invention claimed is:

1. An optical device comprising:
a base that includes a main surface;
a movable unit that is supported in the base to be movable along a predetermined direction that intersects the main surface; and
an optical function unit that is disposed on the movable unit,
wherein the base is constituted by a first semiconductor layer, an insulating layer, and a second semiconductor layer of a semiconductor substrate that includes the first semiconductor layer, the insulating layer, and the second semiconductor layer in this order from one side in the predetermined direction,
the movable unit includes an arrangement portion that is constituted by the second semiconductor layer,
the optical function unit is disposed on a surface of the arrangement portion on the one side,
the first semiconductor layer that constitutes the base is thicker than the second semiconductor layer that constitutes the base,
a surface of the base on the one side is located more to the one side than the optical function unit,
the movable unit further includes a rib portion that is disposed at the periphery of the optical function unit,
an end surface of the rib portion on the one side is located more to the one side than the optical function unit, and
the first semiconductor layer that constitutes the rib portion is thinner than the first semiconductor layer that constitutes the base.

2. The optical device according to claim 1,
wherein the rib portion is disposed on the surface of the arrangement portion on the one side to extend along an outer edge of the arrangement portion when viewed from the predetermined direction.

3. The optical device according to claim 1,
wherein the movable unit further includes a frame portion that surrounds the arrangement portion when viewed from the predetermined direction, and a connection portion that connects the arrangement portion and the frame portion.

4. The optical device according to claim 3,
wherein the frame portion and the connection portion are constituted by the second semiconductor layer.

5. The optical device according to claim 1,
wherein the movable unit further includes a rib portion that is disposed at the periphery of the optical function unit, a frame portion that surrounds the arrangement portion when viewed from the predetermined direction, and a connection portion that connects the arrangement portion and the frame portion, and
the rib portion is disposed on a surface of the frame portion on the one side to extend along the frame portion when viewed from the predetermined direction.

6. The optical device according to claim 1, further comprising:
an electrode pad that is provided to the base,
wherein the electrode pad is disposed on a surface of the second semiconductor layer on the one side in an opening that is formed in a surface of the first semiconductor layer on the one side to reach the second semiconductor layer.

7. The optical device according to claim 6,
wherein the electrode pad extends along a bottom surface and a lateral surface of the opening.

8. The optical device according to claim 6,
wherein each of the electrode pad and the optical function unit is constituted by a metal layer, and
the metal layer that constitutes the electrode pad is thicker than the metal layer that constitutes the optical function unit.

9. A mirror unit comprising:
the optical device according to claim 1;
an optical function member that is disposed on an other side of the one side in the predetermined direction with respect to the optical device; and
a fixed mirror that is disposed on the other side with respect to the optical function member,
wherein the optical function unit is a mirror surface that constitutes a movable mirror in combination with the movable unit.

* * * * *